United States Patent
Jennings et al.

(10) Patent No.: US 11,460,957 B2
(45) Date of Patent: Oct. 4, 2022

(54) ULTRASONIC FINGERPRINT SENSOR WITH A CONTACT LAYER OF NON-UNIFORM THICKNESS

(71) Applicant: InvenSense, Inc., San Jose, CA (US)

(72) Inventors: Mark Jennings, San Jose, CA (US); Mei-Lin Chan, Milpitas, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 17/195,465

(22) Filed: Mar. 8, 2021

(65) Prior Publication Data

US 2021/0278927 A1   Sep. 9, 2021

Related U.S. Application Data

(60) Provisional application No. 62/987,266, filed on Mar. 9, 2020.

(51) Int. Cl.
G06F 3/043 (2006.01)
G06F 3/041 (2006.01)
(Continued)

(52) U.S. Cl.
CPC .......... *G06F 3/0436* (2013.01); *G06F 3/0418* (2013.01); *G06V 40/1306* (2022.01); *H01L 41/047* (2013.01); *H01L 41/083* (2013.01)

(58) Field of Classification Search
CPC ... G06F 3/0436; G06F 3/0418; G06K 9/0002; H01L 41/047; H01L 41/083; G10K 9/125; B06B 1/067
See application file for complete search history.

(56) References Cited

U.S. PATENT DOCUMENTS 4,880,012 A   11/1989   Sato
5,575,286 A   11/1996   Weng et al.
(Continued)

FOREIGN PATENT DOCUMENTS

CN   1826631 A   8/2006
CN   101192644 A   6/2008
(Continued)

OTHER PUBLICATIONS

Tang, et al., "Pulse-Echo Ultrasonic Fingerprint Sensor on a Chip", IEEE Transducers, Anchorage, Alaska, USA, Jun. 21-25, 2015, pp. 674-677.
(Continued)

*Primary Examiner* — Jonathan A Boyd

(57) ABSTRACT

An ultrasonic sensor includes a two-dimensional array of ultrasonic transducers, a contact layer, a matching layer between the two-dimensional array and the contact layer, where the matching layer has a non-uniform thickness, and an array controller configured to control activation of ultrasonic transducers during an imaging operation for imaging a plurality of pixels within the two-dimensional array of ultrasonic transducers. During the imaging operation, the array controller is configured to activate different subsets of ultrasonic transducers associated with different regions of the two-dimensional array of ultrasonic transducers at different transmission frequencies, where the different frequencies are determined such that a thickness of the matching layer at a region is substantially equal to a quarter wavelength of the first transmission frequency for the region. The array controller is also configured to combine the plurality of pixels into a compound fingerprint image that compensates for the non-uniform thickness of the matching layer.

15 Claims, 16 Drawing Sheets

(51) Int. Cl.
*H01L 41/047* (2006.01)
*H01L 41/083* (2006.01)
*G06V 40/13* (2022.01)

(56) References Cited

U.S. PATENT DOCUMENTS

| | | |
|---|---|---|
| 5,680,863 A | 10/1997 | Hossack et al. |
| 5,684,243 A | 11/1997 | Gururaja et al. |
| 5,808,967 A | 9/1998 | Yu et al. |
| 5,867,302 A | 2/1999 | Fleming |
| 5,911,692 A | 6/1999 | Hussain et al. |
| 6,071,239 A | 6/2000 | Cribbs et al. |
| 6,104,673 A | 8/2000 | Cole et al. |
| 6,289,112 B1 | 9/2001 | Jain et al. |
| 6,292,576 B1 | 9/2001 | Brownlee |
| 6,350,652 B1 | 2/2002 | Libera et al. |
| 6,428,477 B1 | 8/2002 | Mason |
| 6,483,932 B1 | 11/2002 | Martinez et al. |
| 6,500,120 B1 | 12/2002 | Anthony |
| 6,676,602 B1 | 1/2004 | Barnes et al. |
| 6,679,844 B2 | 1/2004 | Loftman et al. |
| 6,736,779 B1 | 5/2004 | Sano et al. |
| 7,067,962 B2 | 6/2006 | Scott |
| 7,109,642 B2 | 9/2006 | Scott |
| 7,243,547 B2 | 7/2007 | Cobianu et al. |
| 7,257,241 B2 | 8/2007 | Lo |
| 7,400,750 B2 | 7/2008 | Nam |
| 7,433,034 B1 | 10/2008 | Huang |
| 7,459,836 B2 | 12/2008 | Scott |
| 7,471,034 B2 | 12/2008 | Schlote-Holubek et al. |
| 7,489,066 B2 | 2/2009 | Scott et al. |
| 7,634,117 B2 | 12/2009 | Cho |
| 7,739,912 B2 | 6/2010 | Schneider et al. |
| 8,018,010 B2 | 9/2011 | Tigli et al. |
| 8,139,827 B2 | 3/2012 | Schneider et al. |
| 8,255,698 B2 | 8/2012 | Li et al. |
| 8,311,514 B2 | 11/2012 | Bandyopadhyay et al. |
| 8,335,356 B2 | 12/2012 | Schmitt |
| 8,433,110 B2 | 4/2013 | Kropp et al. |
| 8,508,103 B2 | 8/2013 | Schmitt et al. |
| 8,515,135 B2 | 8/2013 | Clarke et al. |
| 8,666,126 B2 | 3/2014 | Lee et al. |
| 8,703,040 B2 | 4/2014 | Liufu et al. |
| 8,723,399 B2 | 5/2014 | Sammoura et al. |
| 8,805,031 B2 | 8/2014 | Schmitt |
| 9,056,082 B2 | 6/2015 | Liautaud et al. |
| 9,070,861 B2 | 6/2015 | Bibl et al. |
| 9,224,030 B2 | 12/2015 | Du et al. |
| 9,245,165 B2 | 1/2016 | Slaby et al. |
| 9,424,456 B1 | 8/2016 | Kamath Koteshwara et al. |
| 9,572,549 B2 | 2/2017 | Belevich et al. |
| 9,582,102 B2 | 2/2017 | Setlak |
| 9,582,705 B2 | 2/2017 | Du et al. |
| 9,607,203 B1 | 3/2017 | Yazdandoost et al. |
| 9,607,206 B2 | 3/2017 | Schmitt et al. |
| 9,613,246 B1 | 4/2017 | Gozzini et al. |
| 9,618,405 B2 | 4/2017 | Liu et al. |
| 9,665,763 B2 | 5/2017 | Du et al. |
| 9,747,488 B2 | 8/2017 | Yazdandoost et al. |
| 9,785,819 B1 | 10/2017 | Oreifej |
| 9,815,087 B2 | 11/2017 | Ganti et al. |
| 9,817,108 B2 | 11/2017 | Kuo et al. |
| 9,818,020 B2 | 11/2017 | Schuckers et al. |
| 9,881,195 B2 | 1/2018 | Lee et al. |
| 9,881,198 B2 | 1/2018 | Lee et al. |
| 9,898,640 B2 | 2/2018 | Ghavanini |
| 9,904,836 B2 | 2/2018 | Yeke Yazdandoost et al. |
| 9,909,225 B2 | 3/2018 | Lee et al. |
| 9,922,235 B2 | 3/2018 | Cho et al. |
| 9,933,319 B2 | 4/2018 | Li et al. |
| 9,934,371 B2 | 4/2018 | Hong et al. |
| 9,939,972 B2 | 4/2018 | Shepelev et al. |
| 9,953,205 B1 | 4/2018 | Rasmussen et al. |
| 9,959,444 B2 | 5/2018 | Young et al. |
| 9,967,100 B2 | 5/2018 | Hong et al. |
| 9,983,656 B2 | 5/2018 | Merrell et al. |
| 9,984,271 B1 | 5/2018 | King et al. |
| 10,006,824 B2 | 6/2018 | Tsai et al. |
| 10,275,638 B1 | 4/2019 | Yousefpor et al. |
| 10,315,222 B2 | 6/2019 | Salvia et al. |
| 10,322,929 B2 | 6/2019 | Soundara Pandian et al. |
| 10,325,915 B2 | 6/2019 | Salvia et al. |
| 10,387,704 B2 | 8/2019 | Dagan et al. |
| 10,445,547 B2 | 10/2019 | Tsai |
| 10,461,124 B2 | 10/2019 | Berger et al. |
| 10,478,858 B2 | 11/2019 | Lasiter et al. |
| 10,488,274 B2 | 11/2019 | Li et al. |
| 10,497,747 B2 | 12/2019 | Tsai et al. |
| 10,515,255 B2 | 12/2019 | Strohmann et al. |
| 10,539,539 B2 | 1/2020 | Garlepp et al. |
| 10,600,403 B2 | 3/2020 | Garlepp et al. |
| 10,656,255 B2 | 5/2020 | Ng et al. |
| 10,670,716 B2 | 6/2020 | Apte et al. |
| 10,706,835 B2 | 7/2020 | Garlepp et al. |
| 10,726,231 B2 | 7/2020 | Tsai et al. |
| 10,755,067 B2 | 8/2020 | De Foras et al. |
| 11,107,858 B2 | 8/2021 | Berger et al. |
| 2001/0016686 A1 | 8/2001 | Okada et al. |
| 2002/0062086 A1 | 5/2002 | Miele et al. |
| 2002/0135273 A1 | 9/2002 | Mauchamp et al. |
| 2003/0013955 A1 | 1/2003 | Poland |
| 2004/0085858 A1 | 5/2004 | Khuri-Yakub et al. |
| 2004/0122316 A1 | 6/2004 | Satoh et al. |
| 2004/0174773 A1 | 9/2004 | Thomenius et al. |
| 2005/0023937 A1 | 2/2005 | Sashida et al. |
| 2005/0057284 A1 | 3/2005 | Wodnicki |
| 2005/0100200 A1 | 5/2005 | Abiko et al. |
| 2005/0110071 A1 | 5/2005 | Ema et al. |
| 2005/0146240 A1 | 7/2005 | Smith et al. |
| 2005/0148132 A1 | 7/2005 | Wodnicki et al. |
| 2005/0162040 A1 | 7/2005 | Robert |
| 2006/0052697 A1 | 3/2006 | Hossack et al. |
| 2006/0079777 A1 | 4/2006 | Karasawa |
| 2006/0210130 A1 | 9/2006 | Germond-Rouet et al. |
| 2006/0230605 A1 | 10/2006 | Schlote-Holubek et al. |
| 2006/0280346 A1 | 12/2006 | Machida |
| 2007/0046396 A1 | 3/2007 | Huang |
| 2007/0047785 A1 | 3/2007 | Jang et al. |
| 2007/0073135 A1 | 3/2007 | Lee et al. |
| 2007/0202252 A1 | 8/2007 | Sasaki |
| 2007/0215964 A1 | 9/2007 | Khuri-Yakub et al. |
| 2007/0223791 A1 | 9/2007 | Shinzaki |
| 2007/0230754 A1 | 10/2007 | Jain et al. |
| 2008/0125660 A1 | 5/2008 | Yao et al. |
| 2008/0146938 A1 | 6/2008 | Hazard et al. |
| 2008/0150032 A1 | 6/2008 | Tanaka |
| 2008/0194053 A1 | 8/2008 | Huang |
| 2008/0240523 A1 | 10/2008 | Benkley et al. |
| 2009/0005684 A1 | 1/2009 | Kristoffersen et al. |
| 2009/0163805 A1 | 6/2009 | Sunagawa et al. |
| 2009/0182237 A1 | 7/2009 | Angelsen et al. |
| 2009/0232367 A1 | 9/2009 | Shinzaki |
| 2009/0274343 A1 | 11/2009 | Clarke |
| 2009/0303838 A1 | 12/2009 | Svet |
| 2010/0030076 A1 | 2/2010 | Vortman et al. |
| 2010/0046810 A1 | 2/2010 | Yamada |
| 2010/0063391 A1 | 3/2010 | Kanai et al. |
| 2010/0113952 A1 | 5/2010 | Raguin et al. |
| 2010/0168583 A1 | 7/2010 | Dausch et al. |
| 2010/0195851 A1 | 8/2010 | Buccafusca |
| 2010/0201222 A1 | 8/2010 | Adachi et al. |
| 2010/0202254 A1 | 8/2010 | Roest et al. |
| 2010/0239751 A1 | 9/2010 | Regniere |
| 2010/0251824 A1 | 10/2010 | Schneider et al. |
| 2010/0256498 A1 | 10/2010 | Tanaka |
| 2010/0278008 A1 | 11/2010 | Ammar |
| 2011/0285244 A1 | 11/2011 | Lewis et al. |
| 2011/0291207 A1 | 12/2011 | Martin et al. |
| 2012/0016604 A1 | 1/2012 | Irving et al. |
| 2012/0092026 A1 | 4/2012 | Liautaud et al. |
| 2012/0095335 A1* | 4/2012 | Sverdlik ........ A61B 17/320068 600/439 |
| 2012/0095344 A1 | 4/2012 | Kristoffersen et al. |
| 2012/0095347 A1 | 4/2012 | Adam et al. |

(56) References Cited

U.S. PATENT DOCUMENTS

| | | |
|---|---|---|
| 2012/0147698 A1 | 6/2012 | Wong et al. |
| 2012/0179044 A1 | 7/2012 | Chiang et al. |
| 2012/0224041 A1 | 9/2012 | Monden |
| 2012/0232396 A1 | 9/2012 | Tanabe |
| 2012/0238876 A1 | 9/2012 | Tanabe et al. |
| 2012/0263355 A1 | 10/2012 | Monden |
| 2012/0279865 A1 | 11/2012 | Regniere et al. |
| 2012/0288641 A1 | 11/2012 | Diatezua et al. |
| 2012/0300988 A1 | 11/2012 | Ivanov et al. |
| 2013/0051179 A1 | 2/2013 | Hong |
| 2013/0064043 A1 | 3/2013 | Degertekin et al. |
| 2013/0127297 A1* | 5/2013 | Bautista ............ H01L 41/0805 310/334 |
| 2013/0127592 A1 | 5/2013 | Fyke et al. |
| 2013/0133428 A1 | 5/2013 | Lee et al. |
| 2013/0201134 A1 | 8/2013 | Schneider et al. |
| 2013/0271628 A1 | 10/2013 | Ku et al. |
| 2013/0294201 A1 | 11/2013 | Hajati |
| 2013/0294202 A1 | 11/2013 | Hajati |
| 2014/0003679 A1 | 1/2014 | Han et al. |
| 2014/0060196 A1 | 3/2014 | Falter et al. |
| 2014/0117812 A1 | 5/2014 | Hajati |
| 2014/0176332 A1 | 6/2014 | Alameh et al. |
| 2014/0208853 A1 | 7/2014 | Onishi et al. |
| 2014/0219521 A1 | 8/2014 | Schmitt et al. |
| 2014/0232241 A1 | 8/2014 | Hajati |
| 2014/0265721 A1 | 9/2014 | Robinson et al. |
| 2014/0294262 A1 | 10/2014 | Schuckers et al. |
| 2014/0313007 A1 | 10/2014 | Harding |
| 2014/0355387 A1 | 12/2014 | Kitchens et al. |
| 2015/0036065 A1 | 2/2015 | Yousefpor et al. |
| 2015/0049590 A1 | 2/2015 | Rowe et al. |
| 2015/0087991 A1 | 3/2015 | Chen et al. |
| 2015/0097468 A1 | 4/2015 | Hajati et al. |
| 2015/0105663 A1 | 4/2015 | Kiyose et al. |
| 2015/0145374 A1 | 5/2015 | Xu et al. |
| 2015/0164473 A1 | 6/2015 | Kim et al. |
| 2015/0165479 A1 | 6/2015 | Lasiter et al. |
| 2015/0169136 A1 | 6/2015 | Ganti et al. |
| 2015/0189136 A1 | 7/2015 | Chung et al. |
| 2015/0198699 A1 | 7/2015 | Kuo et al. |
| 2015/0206738 A1 | 7/2015 | Rastegar |
| 2015/0213180 A1 | 7/2015 | Herberholz |
| 2015/0220767 A1 | 8/2015 | Yoon et al. |
| 2015/0241393 A1 | 8/2015 | Ganti et al. |
| 2015/0261261 A1 | 9/2015 | Bhagavatula et al. |
| 2015/0286312 A1 | 10/2015 | Kang et al. |
| 2015/0301653 A1 | 10/2015 | Urushi |
| 2015/0324569 A1 | 11/2015 | Hong et al. |
| 2015/0345987 A1 | 12/2015 | Hajati |
| 2015/0357375 A1 | 12/2015 | Tsai et al. |
| 2015/0358740 A1 | 12/2015 | Tsai et al. |
| 2015/0362589 A1 | 12/2015 | Tsai |
| 2015/0371398 A1 | 12/2015 | Qiao et al. |
| 2016/0041047 A1 | 2/2016 | Liu et al. |
| 2016/0051225 A1 | 2/2016 | Kim et al. |
| 2016/0063294 A1 | 3/2016 | Du et al. |
| 2016/0063300 A1 | 3/2016 | Du et al. |
| 2016/0070967 A1 | 3/2016 | Du et al. |
| 2016/0070968 A1 | 3/2016 | Gu et al. |
| 2016/0086010 A1 | 3/2016 | Merrell et al. |
| 2016/0091378 A1 | 3/2016 | Tsai et al. |
| 2016/0092715 A1 | 3/2016 | Yazdandoost et al. |
| 2016/0092716 A1 | 3/2016 | Yazdandoost et al. |
| 2016/0100822 A1 | 4/2016 | Kim et al. |
| 2016/0107194 A1 | 4/2016 | Panchawagh et al. |
| 2016/0117541 A1 | 4/2016 | Lu et al. |
| 2016/0180142 A1 | 6/2016 | Riddle et al. |
| 2016/0296975 A1* | 10/2016 | Lukacs ................ B06B 1/0685 |
| 2016/0299014 A1 | 10/2016 | Li et al. |
| 2016/0326477 A1 | 11/2016 | Fernandez-Alcon et al. |
| 2016/0350573 A1 | 12/2016 | Kitchens et al. |
| 2016/0358003 A1 | 12/2016 | Shen et al. |
| 2017/0004346 A1 | 1/2017 | Kim et al. |
| 2017/0004352 A1 | 1/2017 | Jonsson et al. |
| 2017/0330552 A1 | 1/2017 | Garlepp et al. |
| 2017/0032485 A1 | 2/2017 | Vemury |
| 2017/0059380 A1 | 3/2017 | Li et al. |
| 2017/0075700 A1 | 3/2017 | Abudi et al. |
| 2017/0076132 A1 | 3/2017 | Sezan et al. |
| 2017/0100091 A1 | 4/2017 | Eigil et al. |
| 2017/0110504 A1 | 4/2017 | Panchawagh et al. |
| 2017/0119343 A1 | 5/2017 | Pintoffl |
| 2017/0124374 A1 | 5/2017 | Rowe et al. |
| 2017/0168543 A1 | 6/2017 | Dai et al. |
| 2017/0185821 A1 | 6/2017 | Chen et al. |
| 2017/0194934 A1 | 7/2017 | Shelton et al. |
| 2017/0200054 A1 | 7/2017 | Du et al. |
| 2017/0219536 A1 | 8/2017 | Koch et al. |
| 2017/0231534 A1 | 8/2017 | Agassy et al. |
| 2017/0243049 A1 | 8/2017 | Dong |
| 2017/0255338 A1 | 9/2017 | Medina et al. |
| 2017/0293791 A1 | 10/2017 | Mainguet et al. |
| 2017/0316243 A1 | 11/2017 | Ghavanini |
| 2017/0316248 A1 | 11/2017 | He et al. |
| 2017/0322290 A1 | 11/2017 | Ng |
| 2017/0322291 A1 | 11/2017 | Salvia et al. |
| 2017/0322292 A1 | 11/2017 | Salvia et al. |
| 2017/0322305 A1 | 11/2017 | Apte et al. |
| 2017/0323133 A1 | 11/2017 | Tsai |
| 2017/0325081 A1 | 11/2017 | Chrisikos et al. |
| 2017/0326590 A1 | 11/2017 | Daneman |
| 2017/0326591 A1 | 11/2017 | Apte et al. |
| 2017/0326593 A1 | 11/2017 | Garlepp et al. |
| 2017/0326594 A1 | 11/2017 | Berger et al. |
| 2017/0328866 A1 | 11/2017 | Apte et al. |
| 2017/0328870 A1 | 11/2017 | Garlepp et al. |
| 2017/0330012 A1 | 11/2017 | Salvia et al. |
| 2017/0330553 A1 | 11/2017 | Garlepp et al. |
| 2017/0344782 A1 | 11/2017 | Andersson |
| 2017/0357839 A1 | 12/2017 | Yazdandoost et al. |
| 2018/0025202 A1 | 1/2018 | Ryshtun et al. |
| 2018/0032788 A1 | 2/2018 | Krenzer et al. |
| 2018/0101711 A1 | 4/2018 | D'Souza et al. |
| 2018/0107852 A1 | 4/2018 | Fenrich et al. |
| 2018/0107854 A1 | 4/2018 | Tsai et al. |
| 2018/0129849 A1* | 5/2018 | Strohmann ............ G06F 21/32 |
| 2018/0129857 A1 | 5/2018 | Bonev |
| 2018/0150679 A1 | 5/2018 | Kim et al. |
| 2018/0178251 A1 | 6/2018 | Foncellino et al. |
| 2018/0206820 A1 | 7/2018 | Anand et al. |
| 2018/0217008 A1 | 8/2018 | Li et al. |
| 2018/0225495 A1 | 8/2018 | Jonsson et al. |
| 2018/0229267 A1 | 8/2018 | Ono et al. |
| 2018/0268232 A1 | 9/2018 | Kim et al. |
| 2018/0276443 A1 | 9/2018 | Strohmann et al. |
| 2018/0276672 A1 | 9/2018 | Breed et al. |
| 2018/0329560 A1 | 11/2018 | Kim et al. |
| 2018/0341799 A1 | 11/2018 | Schwartz et al. |
| 2018/0349663 A1 | 12/2018 | Garlepp et al. |
| 2018/0357457 A1 | 12/2018 | Rasmussen et al. |
| 2018/0369866 A1 | 12/2018 | Sammoura et al. |
| 2018/0373913 A1 | 12/2018 | Panchawagh et al. |
| 2019/0005300 A1 | 1/2019 | Garlepp et al. |
| 2019/0012673 A1 | 1/2019 | Chakraborty et al. |
| 2019/0018123 A1 | 1/2019 | Narasimha-Iyer et al. |
| 2019/0043920 A1 | 2/2019 | Berger et al. |
| 2019/0046263 A1 | 2/2019 | Hayashida et al. |
| 2019/0057267 A1 | 2/2019 | Kitchens et al. |
| 2019/0073507 A1 | 3/2019 | D'Souza et al. |
| 2019/0087632 A1 | 3/2019 | Raguin et al. |
| 2019/0095015 A1* | 3/2019 | Han ..................... G06F 3/0412 |
| 2019/0102046 A1 | 4/2019 | Miranto et al. |
| 2019/0130083 A1 | 5/2019 | Agassy et al. |
| 2019/0171858 A1 | 6/2019 | Ataya et al. |
| 2019/0175035 A1 | 6/2019 | Van Der Horst et al. |
| 2019/0188441 A1 | 6/2019 | Hall et al. |
| 2019/0188442 A1 | 6/2019 | Flament et al. |
| 2019/0247887 A1 | 8/2019 | Salvia et al. |
| 2019/0311177 A1 | 10/2019 | Joo et al. |
| 2019/0325185 A1 | 10/2019 | Tang |
| 2019/0340455 A1 | 11/2019 | Jung et al. |
| 2019/0370518 A1 | 12/2019 | Maor et al. |
| 2020/0030850 A1 | 1/2020 | Apte et al. |

(56) References Cited

U.S. PATENT DOCUMENTS

| | | |
|---|---|---|
| 2020/0050816 A1 | 2/2020 | Tsai |
| 2020/0050817 A1 | 2/2020 | Salvia et al. |
| 2020/0050820 A1 | 2/2020 | Iatsun et al. |
| 2020/0050828 A1 | 2/2020 | Li et al. |
| 2020/0074135 A1 | 3/2020 | Garlepp et al. |
| 2020/0111834 A1 | 4/2020 | Tsai et al. |
| 2020/0125710 A1 | 4/2020 | Andersson et al. |
| 2020/0147644 A1 | 5/2020 | Chang |
| 2020/0158694 A1 | 5/2020 | Garlepp et al. |
| 2020/0175143 A1 | 6/2020 | Lee et al. |
| 2020/0194495 A1 | 6/2020 | Berger et al. |
| 2020/0210666 A1 | 7/2020 | Flament |
| 2020/0250393 A1 | 8/2020 | Tsai et al. |
| 2020/0285882 A1 | 9/2020 | Skovgaard Christensen et al. |
| 2020/0302140 A1 | 9/2020 | Lu et al. |
| 2020/0342203 A1 | 10/2020 | Lin et al. |
| 2020/0355824 A1 | 11/2020 | Apte et al. |
| 2020/0400800 A1 | 12/2020 | Ng et al. |
| 2020/0410070 A1 | 12/2020 | Strohmann |
| 2020/0410193 A1 | 12/2020 | Wu |

FOREIGN PATENT DOCUMENTS

| | | |
|---|---|---|
| CN | 102159334 A | 8/2011 |
| CN | 105264542 A | 1/2016 |
| CN | 105378756 A | 3/2016 |
| CN | 106458575 B | 7/2018 |
| CN | 109196671 A | 1/2019 |
| CN | 109255323 A | 1/2019 |
| EP | 1214909 A1 | 6/2002 |
| EP | 2884301 A1 | 6/2015 |
| EP | 3086261 A2 | 10/2016 |
| EP | 1534140 B1 | 1/2019 |
| EP | 3292508 B1 | 12/2020 |
| EP | 3757884 A1 | 12/2020 |
| JP | 2011040467 A | 2/2011 |
| TW | 201531701 A | 8/2015 |
| WO | 2009096576 A2 | 8/2009 |
| WO | 2009137106 A2 | 11/2009 |
| WO | 2014035564 A1 | 3/2014 |
| WO | 2015009635 A1 | 1/2015 |
| WO | 2015112453 A1 | 7/2015 |
| WO | 2015120132 A1 | 8/2015 |
| WO | 2015131083 A1 | 9/2015 |
| WO | 2015134816 A1 | 9/2015 |
| WO | 2015183945 A1 | 12/2015 |
| WO | 2016007250 A1 | 1/2016 |
| WO | 2016011172 A1 | 1/2016 |
| WO | 2016022439 A1 | 2/2016 |
| WO | 2016040333 A2 | 3/2016 |
| WO | 2016053587 A1 | 4/2016 |
| WO | 2016061406 A1 | 4/2016 |
| WO | 2016061410 A1 | 4/2016 |
| WO | 2017003848 A1 | 1/2017 |
| WO | 2017053877 A2 | 3/2017 |
| WO | 2017192890 A1 | 11/2017 |
| WO | 2017192895 A1 | 11/2017 |
| WO | 2017192899 A1 | 11/2017 |
| WO | 2017196678 A1 | 11/2017 |
| WO | 2017196681 A1 | 11/2017 |
| WO | 2017196682 A1 | 11/2017 |
| WO | 2017192903 A3 | 12/2017 |
| WO | 2018148332 A1 | 8/2018 |
| WO | 2019005487 A1 | 1/2019 |
| WO | 2019164721 A1 | 8/2019 |
| WO | 2020081182 A1 | 4/2020 |

OTHER PUBLICATIONS

ISA/EP, Partial International Search Report for International Application No. PCT/US2019/034032, 8 pages, dated Sep. 12, 2019, 8.
ISA/EP, International Search Report and Written Opinion for International Application # PCT/US2018/063431, pp. 1-15, dated Feb. 5, 2019.
ISA/EP, International Search Report and Written Opinion for International Application # PCT/US2019/015020, pp. 1-23, dated Jul. 1, 2019.
ISA/EP, International Search Report and Written Opinion for International Application # PCT/US2019/023440, pp. 1-10, dated Jun. 4, 2019.
ISA/EP, International Search Report and Written Opinion for International Application No. PCT/US2017/031120, 12 pages, dated Aug. 29, 2017.
ISA/EP, International Search Report and Written Opinion for International Application No. PCT/US2017/031127, 13 pages, dated Sep. 1, 2017.
ISA/EP, International Search Report and Written Opinion for International Application No. PCT/US2017/031134, 12 pages, dated Aug. 30, 2017.
ISA/EP, International Search Report and Written Opinion for International Application No. PCT/US2017/031140, 18 pages, dated Nov. 2, 2017.
ISA/EP, International Search Report and Written Opinion for International Application No. PCT/US2017/031421 13 pages, dated Jun. 21, 2017.
ISA/EP, International Search Report and Written Opinion for International Application No. PCT/US2017/031426 13 pages, dated Jun. 22, 2017.
ISA/EP, International Search Report and Written Opinion for International Application No. PCT/US2017/031431, 14 pages, dated Aug. 1, 2017.
ISA/EP, International Search Report and Written Opinion for International Application No. PCT/US2017/031434, 13 pages, dated Jun. 26, 2017.
ISA/EP, International Search Report and Written Opinion for International Application No. PCT/US2017/031439, 10 pages, dated Jun. 20, 2017.
ISA/EP, International Search Report and Written Opinion for International Application No. PCT/US2017/031824, 18 pages, dated Sep. 22, 2017.
ISA/EP, International Search Report and Written Opinion for International Application No. PCT/US2017/031827, 16 pages, dated Aug. 1, 2017.
ISA/EP, International Search Report and Written Opinion for International Application No. PCT/US2017/031831, 12 pages, dated Jul. 21, 2017.
ISA/EP, International Search Report and Written Opinion for International Application No. PCT/US2018/037364, 10 pages, dated Sep. 3, 2018.
ISA/EP, International Search Report and Written Opinion for International Application No. PCT/US2020/033854, 16 pages, dated Nov. 3, 2020.
ISA/EP, International Search Report and Written Opinion for International Application No. PCT/US2020/039208, 10 pages, dated Oct. 9, 2020.
ISA/EP, International Search Report and Written Opinion for International Application No. PCT/US2020/039452, 11 pages, dated Sep. 9, 2020.
ISA/EP, International Search Report and Written Opinion for International Application No. PCT/US2020/042427, 18 pages, dated Dec. 14, 2020.
ISA/EP, International Search Report and Written Opinion for International Application No. PCT/US2020/042428, 9 pages, dated Oct. 26, 2020.
ISA/EP, International Search Report for International Application No. PCT/US2017/031826, 16 pages, dated Feb. 27, 2018.
ISA/EP, Partial International Search Report for International Application No. PCT/US2017/031140, 13 pages, dated Aug. 29, 2017.
ISA/EP, Partial International Search Report for International Application No. PCT/US2017/031823, 12 pages, dated Nov. 30, 2017.
ISA/EP, Partial Search Report and Provisional Opinion for International Application No. PCT/US2020/042427, 13 pages, dated Oct. 26, 2020.
ISA/EP, Partial Search Report for International Application No. PCT/US2020/033854, 10 pages, dated Sep. 8, 2020.
"Moving Average Filters", Waybackmachine XP05547422, Retrieved from the Internet: URL:https://web.archive.org/web/20170809081353/

(56) References Cited

OTHER PUBLICATIONS https//www.analog.com/media/en/technical-documentation/dsp-book/dsp_book_Ch15.pdf [retrieved on Jan. 24, 2019], Aug. 9, 2017, 1-8.

Office Action for CN App No. 201780029016.7 dated Mar. 24, 2020, 7 pages.

Office Action for CN App No. 201780029016.7 dated Sep. 25, 2020, 7 pages.

Office Action for TW App No. 106113266 dated Jun. 22, 2020, 23 pages.

"Receiver Thermal Noise Threshold", Fisher Telecommunication Services, Satellite Communications. Retrieved from the Internet URL:https://web.archive.org/web/20171027075705/http://www.fishercom.xyz:80/satellite-communications/receiver-thermal-noise-threshold.html, Oct. 27, 2017, 3.

"Sleep Mode", Wikipedia, Retrieved from the Internet: URL:https://web.archive.org/web/20170908153323/https://en.wikipedia.org/wiki/Sleep_mode [retrieved on Jan. 25, 2019], Sep. 8, 2017, 1-3.

"TMS320C5515 Fingerprint Development Kit (FDK) Hardware Guide", Texas Instruments, Literature No. SPRUFX3, XP055547651, Apr. 2010, 1-26.

"ZTE V7 Max. 5,5" smartphone on MediaTeck Helio P10 cpu; Published on Apr. 20, 2016; https://www.youtube.com/watch?v=ncNCbpkGQzU (Year: 2016)".

Cappelli, et al., "Fingerprint Image Reconstruction from Standard Templates", IEEE Transactions on Pattern Analysis and Machine Intfii Igence, IEEE Computer Society, vol. 29, No. 9, Sep. 2007, 1489-1503.

Feng, et al., "Fingerprint Reconstruction: From Minutiae to Phase", IEEE Transactions on Pattern Analysis and Machine Intelligence, IEEE Computer Society, vol. 33, No. 2, Feb. 2011, 209-223.

Jiang, et al., "Ultrasonic Fingerprint Sensor with Transmit Beamforming Based on a PMUT Array Bonded to CMOS Circuitry", IEEE Transactions on Ultrasonics Ferroelectrics and Frequency Control, Jan. 1, 2017, 1-9.

Kumar, et al., "Towards Contactless, Low-Cost and Accurate 3D Fingerprint Identification", IEEE Transactions on Pattern Analysis and Machine Intelligence, IEEE Computer Society, vol. 37, No. 3, Mar. 2015, 681-696.

Lee, et al., "Low jitter and temperature stable MEMS oscillators", Frequency Control Symposium (FCS), 2012 IEEE International, May 2012, 1-5.

Li, et al., "Capacitive micromachined ultrasonic transducer for ultra-low pressure measurement: Theoretical study", AIP Advances 5.12. Retrieved from Internet: http://scitation.aip.org/content/aip/journal/adva/5/12/10.1063/1.4939217, 2015, 127231.

Pang, et al., "Extracting Valley-Ridge Lines from Point-Cloud-Based 3D Fingerprint Models", IEEE Computer Graphics and Applications, IEEE Service Center, New York, vol. 33, No. 4, Jul./Aug. 2013, 73-81.

Papageorgiou, et al., "Self-Calibration of Ultrasonic Transducers in an Intelligent Data Acquisition System", International Scientific Journal of Computing, 2003, vol. 2, Issue 2 Retrieved Online: URL: https://scholar.google.com/scholar?q=self-calibration+of+ultrasonic+transducers+in+an+intelligent+data+acquisition+system&hl=en&as_sdt=0&as_vis=1&oi=scholart, 2003, 9-15.

Ross, et al., "From Template to Image: Reconstructing Fingerprints from Minutiae Points", IEEE Transactions on Pattern Analysis and Machine Intelligence, IEEE Computer Society, vol. 29, No. 4, Apr. 2007, 544-560.

Rozen, et al., "Air-Coupled Aluminum Nitride Piezoelectric Micromachined Ultrasonic Fransducers at 0.3 MHZ To 0.9 MHZ", 2015 28th IEEE International Conference on Micro Electro Mechanical Systems (MEMS), IEEE, Jan. 18, 2015, 921-924.

Shen, et al., "Anisotropic Complementary Acoustic Metamaterial for Canceling out Aberrating Layers", American Physical Society, Physical Review X 4.4: 041033., Nov. 19, 2014, 041033-1-041033-7.

Tang, et al., "11.2 3D Ultrasonic Fingerprint Sensor-on-a-Chip", 2016 IEEE International Solid-State Circuits Conference, IEEE, Jan. 31, 2016, 202-203.

Thakar, et al., "Multi-resonator approach to eliminating the temperature dependence of silicon-based timing references", Hilton Head'14. Retrieved from the Internet: http://blog.narotama.ac.id/wp-content/uploads/2014/12/Multi-resonator-approach-to-eliminating-the-temperature-dependance-of-silicon-based-timing-references.pdf, 2014, 415-418.

Zhou, et al., "Partial Fingerprint Reconstruction with Improved Smooth Extension", Network and System Security, Springer Berlin Heidelberg, Jun. 3, 2013, 756-762.

Dausch, et al., "Theory and Operation of 2-D Array Piezoelectric Micromachined Ultrasound Transducers", IEEE Transactions on Ultrasonics, and Frequency Control, vol. 55, No. 11;, Nov. 2008, 2484-2492.

Hopcroft, et al., "Temperature Compensation of a MEMS Resonator Using Quality Factor as a Thermometer", Retrieved from Internet: http://micromachine.stanford.edu/~amanu/linked/MAH_MEMS2006.pdf, 2006, 222-225.

Hopcroft, et al., "Using the temperature dependence of resonator quality factor as a thermometer", Applied Physics Letters 91. Retrieved from Internet: http://micromachine.stanford.edu/~hopcroft/Publications/Hopcroft_QT_ApplPhysLett_91_013505.pdf, 2007, 013505-1-031505-3.

Qiu, et al., "Piezoelectric Micromachined Ultrasound Transducer (PMUT) Arrays for Integrated Sensing, Actuation and Imaging", Sensors 15, doi:10.3390/s150408020, Apr. 3, 2015, 8020-8041.

Savoia, et al., "Design and Fabrication of a cMUT Probe for Ultrasound Imaging of Fingerprints", 2010 IEEE International Ultrasonics Symposium Proceedings, Oct. 2010, 1877-1880.

EP Office Action, for Application 17724184.1, dated Oct. 12, 2021, 6 pages.

EP Office Action, dated Oct. 9, 2021, 6 pages.

European Patent Office, Office Action, App 17725018, pp. 5, dated Oct. 25, 2021.

European Patent Office, Office Action, App 17725020.6, pp. 4, dated Oct. 25, 2021.

ISA/EP, International Search Report and Written Opinion for International Application No. PCT/US2019061516, 14 pages, dated Mar. 12, 2020.

ISA/EP, International Search Report and Written Opinion for International Application No. PCT/US2021/021412, 12 pages, dated Jun. 9, 2021.

ISA/EP, International Search Report and Written Opinion for International Application No. PCT/US2021/021561, 9 pages, dated Jun. 28, 2021.

Taiwan Application No. 106114623, 1st Office Action, dated Aug. 5, 2021, pp. 1-8.

Tang, et al., "Pulse-echo ultrasonic fingerprint sensor on a chip", 2015 Transducers, 2015 18th International Conference on Solid-State Sensors, Actuators and Microsystems, Apr. 1, 2015, 674-677.

EP Office Action, for Application 17725017.2 dated Feb. 25, 2022, 7 pages.

\* cited by examiner

1000

ACTIVATE A FIRST SUBSET OF ULTRASONIC TRANSDUCERS ASSOCIATED WITH A FIRST REGION AT A FIRST TRANSMISSION FREQUENCY
1010

ACTIVATE A SECOND SUBSET OF ULTRASONIC TRANSDUCERS ASSOCIATED WITH A SECOND REGION AT A SECOND TRANSMISSION FREQUENCY
1020

ACTIVATE A THIRD SUBSET OF ULTRASONIC TRANSDUCERS ASSOCIATED WITH A THIRD REGION AT A THIRD TRANSMISSION FREQUENCY
1030

COMBINE THE CAPTURED PIXELS INTO A COMPOUND FINGERPRINT IMAGE
1040

```
┌─────────────────────────────────────────────────────────────┐
│ ACTIVATE ULTRASONIC TRANSDUCERS AT A PLURALITY OF REGIONS   │
│ OF A TWO-DIMENSIONAL ARRAY OF ULTRASONIC TRANSDUCERS AT A   │
│         PLURALITY OF TRANSMISSION FREQUENCIES               │
│                          1110                               │
└─────────────────────────────────────────────────────────────┘
                              │
                              ▼
┌─────────────────────────────────────────────────────────────┐
│   MONITOR A SIGNAL FOR EACH OF THE PLURALITY OF TRANSMISSION│
│         FREQUENCIES AT THE PLURALITY OF REGIONS             │
│                          1120                               │
└─────────────────────────────────────────────────────────────┘
                              │
                              ▼
┌─────────────────────────────────────────────────────────────┐
│   DETERMINE HOW ULTRASONIC TRANSDUCERS ARE GROUPED WITH     │
│              THE AVAILABLE FREQUENCIES                      │
│                          1130                               │
└─────────────────────────────────────────────────────────────┘
                              │
                              ▼
┌─────────────────────────────────────────────────────────────┐
│      SET A TRANSMISSION FREQUENCY OF THE PLURALITY OF       │
│  TRANSMISSION FREQUENCIES HAVING A HIGHEST SIGNAL AS THE    │
│       TRANSMISSION FREQUENCY FOR EACH REGION                │
│                          1140                               │
└─────────────────────────────────────────────────────────────┘
```

FIG. 11

ULTRASONIC FINGERPRINT SENSOR WITH A CONTACT LAYER OF NON-UNIFORM THICKNESS

RELATED APPLICATIONS

This application claims priority to and the benefit of U.S. Provisional Patent Application 62/987,266, filed on Mar. 9, 2020, entitled "ULTRASONIC FINGERPRINT SENSOR WITH A CONTACT LAYER OF NON-UNIFORM THICKNESS," by Mark Jennings et al., and assigned to the assignee of the present application, which is incorporated herein by reference in its entirety.

BACKGROUND

Fingerprint sensors have become ubiquitous in mobile devices as well as other applications for authenticating a user's identity. They provide a fast and convenient way for the user to unlock a device, provide authentication for payments, etc. Current fingerprint sensors are typically area sensors that obtain a two-dimensional image of the user's finger area presented to the sensor. Different technologies can be used to image the finger such as capacitive, ultrasound, and optical sensing. Once an image is obtained, that image is processed by a matcher to extract features and to compare against stored images to authenticate the user. As such, accuracy of captured images is essential to the performance of image matching for user authentication.

BRIEF DESCRIPTION OF THE DRAWINGS

The accompanying drawings, which are incorporated in and form a part of the Description of Embodiments, illustrate various embodiments of the subject matter and, together with the Description of Embodiments, serve to explain principles of the subject matter discussed below. Unless specifically noted, the drawings referred to in this Brief Description of Drawings should be understood as not being drawn to scale. Herein, like items are labeled with like item numbers.

FIG. 10 illustrates a flow diagram of an example method for operating an ultrasonic sensor including a two-dimensional array of ultrasonic transducers, according to embodiments.

FIG. 11 illustrates a flow diagram of an example method for calibrating an ultrasonic sensor including a two-dimensional array of ultrasonic transducers, according to embodiments.

DESCRIPTION OF EMBODIMENTS

Figure 1A:
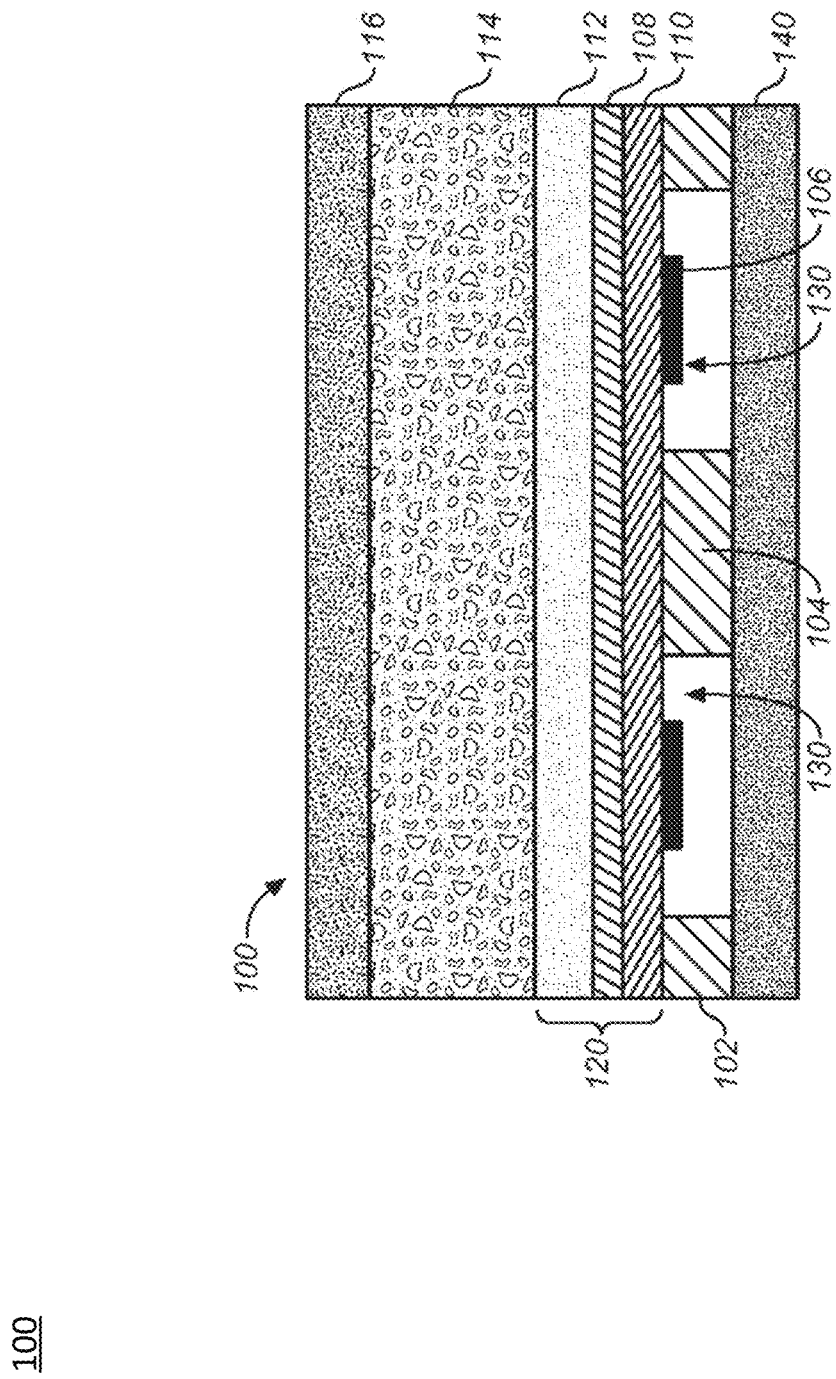
FIG. 1A is a diagram illustrating a piezoelectric micromachined ultrasonic transducer (PMUT) device having a center pinned membrane, according to some embodiments.

The following Description of Embodiments is merely provided by way of example and not of limitation. Furthermore, there is no intention to be bound by any expressed or implied theory presented in the preceding background or in the following Description of Embodiments.

Reference will now be made in detail to various embodiments of the subject matter, examples of which are illustrated in the accompanying drawings. While various embodiments are discussed herein, it will be understood that they are not intended to limit to these embodiments. On the contrary, the presented embodiments are intended to cover alternatives, modifications and equivalents, which may be included within the spirit and scope the various embodiments as defined by the appended claims. Furthermore, in this Description of Embodiments, numerous specific details are set forth in order to provide a thorough understanding of embodiments of the present subject matter. However, embodiments may be practiced without these specific details. In other instances, well known methods, procedures, components, and circuits have not been described in detail as not to unnecessarily obscure aspects of the described embodiments.

Notation and Nomenclature

Some portions of the detailed descriptions which follow are presented in terms of procedures, logic blocks, processing and other symbolic representations of operations on data within an electrical device. These descriptions and representations are the means used by those skilled in the data processing arts to most effectively convey the substance of their work to others skilled in the art. In the present application, a procedure, logic block, process, or the like, is conceived to be one or more self-consistent procedures or instructions leading to a desired result. The procedures are those requiring physical manipulations of physical quantities. Usually, although not necessarily, these quantities take the form of acoustic (e.g., ultrasonic) signals capable of being transmitted and received by an electronic device and/or electrical or magnetic signals capable of being stored, transferred, combined, compared, and otherwise manipulated in an electrical device.

It should be borne in mind, however, that all of these and similar terms are to be associated with the appropriate physical quantities and are merely convenient labels applied to these quantities. Unless specifically stated otherwise as apparent from the following discussions, it is appreciated that throughout the description of embodiments, discussions utilizing terms such as "performing," "controlling," "capturing," "activating," "generating," "combining," "transmitting," "receiving," "activating," "combining," "determining," or the like, refer to the actions and processes of an electronic device such as an electrical device.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, logic, circuits, and steps have been described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example fingerprint sensing system and/or mobile electronic device described herein may include components other than those shown, including well-known components.

Various techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, perform one or more of the methods described herein. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

Various embodiments described herein may be executed by one or more processors, such as one or more motion processing units (MPUs), sensor processing units (SPUs), host processor(s) or core(s) thereof, digital signal processors (DSPs), general purpose microprocessors, application specific integrated circuits (ASICs), application specific instruction set processors (ASIPs), field programmable gate arrays (FPGAs), a programmable logic controller (PLC), a complex programmable logic device (CPLD), a discrete gate or transistor logic, discrete hardware components, or any combination thereof designed to perform the functions described herein, or other equivalent integrated or discrete logic circuitry. The term "processor," as used herein may refer to any of the foregoing structures or any other structure suitable for implementation of the techniques described herein. As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Moreover, processors can exploit nano-scale architectures such as, but not limited to, molecular and quantum-dot based transistors, switches and gates, in order to optimize space usage or enhance performance of user equipment. A processor may also be implemented as a combination of computing processing units.

In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU/MPU and a microprocessor, a plurality of microprocessors, one or more microprocessors in conjunction with an SPU core, MPU core, or any other such configuration.

Overview of Discussion

Discussion begins with a description of an example piezoelectric micromachined ultrasonic transducer (PMUT), in accordance with various embodiments. Example arrays including PMUT devices are then described. Examples of the ultrasonic fingerprint sensors having a matching layer with a thickness substantially equal to a quarter wavelength of the first transmission frequency are then described. Examples of operations for operating an ultrasonic fingerprint sensor are then described.

Fingerprint sensors, in accordance with the described embodiments, are used for capturing fingerprint images that are used for performing fingerprint authentication. As the use of fingerprint sensors proliferates, there is a desire to include fingerprint sensors in devices having varying form factors. In many potential use cases, an ultrasonic fingerprint sensor is overlaid with a contact layer that is not flat (e.g., has a curved profile, a sloped profile, rounded edges, etc.) In other situations, the contact layer can be comprised of materials having varying acoustic impedances, where the acoustic impedance of a material may impact the amount of acoustic signal that can be transmitted through the contact layer. In such use cases, a matching layer between the contact layer and the fingerprint sensor is used to provide a transmission medium for ultrasonic signals between the contact layer and the fingerprint sensor. For example, the matching layer may be an adhesive layer (e.g., epoxy) for bonding the contact layer to the fingerprint sensor. Where the contact layer is not flat, the variation in material thickness (contact layer and matching layer combined) may result in a reduction of signal strength. Moreover, a matching layer having a non-uniform thickness will have inconsistent signal strength associated with a constant transmission frequency. Embodiments described herein account for the non-uniform thickness of the matching layer.

Embodiments described herein provide a sensor device including a two-dimensional array of ultrasonic transducers, a contact layer, a matching layer between the two-dimensional array and the contact layer, where the matching layer has a non-uniform thickness, and an array controller configured to control activation of ultrasonic transducers during an imaging operation for imaging a plurality of pixels within the two-dimensional array of ultrasonic transducers. In some embodiments, the matching layer is an adhesive layer for bonding the two-dimensional array of ultrasonic transducers to the contact layer.

In some embodiments, the matching layer has an acoustic impedance between an acoustic impedance of the two-dimensional array of ultrasonic transducers and an acoustic impedance of the contact layer. In some embodiments, the ultrasonic sensor further includes a packaging epoxy overlying the two-dimensional array of ultrasonic transducers, such that the matching layer is connected to the packaging epoxy and the contact layer. In some embodiments, a first thickness of the matching layer at a first region is substantially equal to a quarter wavelength of the first transmission frequency plus or minus a one-eighth wavelength of the first transmission frequency and a second thickness of the matching layer at a second region is substantially equal to a quarter wavelength of the second transmission frequency plus or minus a one-eighth wavelength of the second transmission frequency.

During the imaging operation, the array controller is configured to activate different subsets of ultrasonic transducers associated with different regions of the two-dimensional array of ultrasonic transducers at different transmission frequencies, where the different frequencies are determined such that a thickness of the matching layer at a region is substantially equal to a quarter wavelength of the first transmission frequency for the region. The array controller is also configured to combine the plurality of pixels into a compound fingerprint image that compensates for the non-uniform thickness of the matching layer. In some embodiments, a first region and a second region are associated with different blocks of ultrasonic transducers of the two-dimensional array of ultrasonic transducers. In some embodiments, a first region and a second region are associated with different columns of ultrasonic transducers of the two-dimensional array of ultrasonic transducers. In some embodiments, a first region and a second region are associated with different rows of ultrasonic transducers of the two-dimensional array of ultrasonic transducers.

Embodiments described herein also provide a method for calibrating an ultrasonic sensor including a two-dimensional array of ultrasonic transducers, a contact layer overlying the two-dimensional array of ultrasonic transducers, and a matching layer between the two-dimensional array of ultrasonic transducers and the contact layer, where the matching layer has a non-uniform thickness overlying the two-dimensional array of ultrasonic transducers.

In some embodiments, a thickness of the matching layer at each region is substantially equal to a quarter wavelength of a transmission frequency for the region. In some embodiments, the thickness of the matching layer at each region is substantially equal to a quarter wavelength of the transmission frequency plus or minus a one-eighth wavelength of the transmission frequency at the region. In some embodiments, the matching layer is an adhesive layer for bonding the two-dimensional array of ultrasonic transducers to the contact layer. In some embodiments, the matching layer has an acoustic impedance between an acoustic impedance of the two-dimensional array of ultrasonic transducers and an acoustic impedance of the contact layer.

Ultrasonic transducers of the two-dimensional array of ultrasonic transducers associated with a plurality of regions of the two-dimensional array of ultrasonic transducers are activated at a plurality of transmission frequencies, where the plurality of regions are non-overlapping. A signal for each of the plurality of transmission frequencies at the plurality of regions is monitored. For the plurality of regions, a transmission frequency of the plurality of transmission frequencies having a highest signal for a region is set as the transmission frequency for the region.

Piezoelectric Micromachined Ultrasonic Transducer (PMUT)

Systems and methods disclosed herein, in one or more aspects provide efficient structures for an acoustic transducer (e.g., a piezoelectric micromachined actuated transducer or PMUT). One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details. In other instances, well-known structures and devices are shown in block diagram form in order to facilitate describing the embodiments in additional detail.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the word "example" is used herein to mean serving as an example, instance, or illustration.

Embodiments described herein provide ultrasonic fingerprint sensors having non-uniform contact layers. It should be appreciated that different types of ultrasonic fingerprint sensors having different architectures may be utilized herein. For instance, some architectures include an array of ultrasonic transducers (e.g., PMUTs), embodiments of which are described herein. In some embodiments, the ultrasonic transducers may be bulk piezo actuator elements, e.g., lead zirconate titanate (PZT). Other architectures may utilize a film-based design. Although embodiments are described herein with respect to an array of ultrasonic transducers, the methods and techniques may be applied to other ultrasonic sensing architectures where the control of the operating parameters of different segments of the sensors can be adjusted separately to correct for the non-uniform contact surface. The embodiments described herein are with respect to sensors with a non-uniform contact layer, but the techniques and principles discussed may in some situations also be used to improve performance of sensors with uniform contact surfaces.

FIG. 1A is a diagram illustrating a PMUT device 100 having a center pinned membrane, according to some embodiments. PMUT device 100 includes an interior pinned membrane 120 positioned over a substrate 140 to define a cavity 130. In one embodiment, membrane 120 is attached both to a surrounding edge support 102 and interior support 104. In one embodiment, edge support 102 is connected to an electric potential. Edge support 102 and interior support 104 may be made of electrically conducting materials, such as and without limitation, aluminum, molybdenum, or titanium. Edge support 102 and interior support 104 may also be made of dielectric materials, such as silicon dioxide, silicon nitride or aluminum oxide that have electrical connections on the sides or in vias through edge support 102 or interior support 104, electrically coupling lower electrode 106 to electrical wiring in substrate 140.

In one embodiment, both edge support 102 and interior support 104 are attached to a substrate 140. In various embodiments, substrate 140 may include at least one of, and without limitation, silicon or silicon nitride. It should be appreciated that substrate 140 may include electrical wirings and connection, such as aluminum or copper. In one embodiment, substrate 140 includes a CMOS logic wafer bonded to edge support 102 and interior support 104. In one embodiment, the membrane 120 comprises multiple layers. In an example embodiment, the membrane 120 includes lower electrode 106, piezoelectric layer 110, and upper electrode 108, where lower electrode 106 and upper electrode 108 are coupled to opposing sides of piezoelectric layer 110. As shown, lower electrode 106 is coupled to a lower surface of piezoelectric layer 110 and upper electrode 108 is coupled to an upper surface of piezoelectric layer 110. It should be appreciated that, in various embodiments, PMUT device 100 is a microelectromechanical (MEMS) device.

In one embodiment, membrane 120 also includes a mechanical support layer 112 (e.g., stiffening layer) to mechanically stiffen the layers. In various embodiments, mechanical support layer 112 may include at least one of, and without limitation, silicon, silicon oxide, silicon nitride, aluminum, molybdenum, titanium, etc. In one embodiment, PMUT device 100 also includes an acoustic coupling layer 114 above membrane 120 for supporting transmission of acoustic signals. It should be appreciated that acoustic coupling layer can include air, liquid, gel-like materials, epoxy, or other materials for supporting transmission of acoustic signals. In one embodiment, PMUT device 100 also includes platen layer 116 above acoustic coupling layer 114 for containing acoustic coupling layer 114 and providing a contact surface for a finger or other sensed object with PMUT device 100. It should be appreciated that, in various embodiments, acoustic coupling layer 114 provides a contact surface, such that platen layer 116 is optional. Moreover, it should be appreciated that acoustic coupling layer 114 and/or platen layer 116 may be included with or used in conjunction with multiple PMUT devices. For example, an array of PMUT devices may be coupled with a single acoustic coupling layer 114 and/or platen layer 116. It should be appreciated that platen layer 116 can include one or more materials, including without limitation: glass, plastic, metal (e.g., aluminum, titanium, stainless steel), etc. In some embodiments, platen 116 is a display device (e.g., an organic light emitting diode (OLED) display device) overlying one or more PMUT devices. In such an embodiment, platen 116 includes multiple layers of the display device.

Figure 1B:
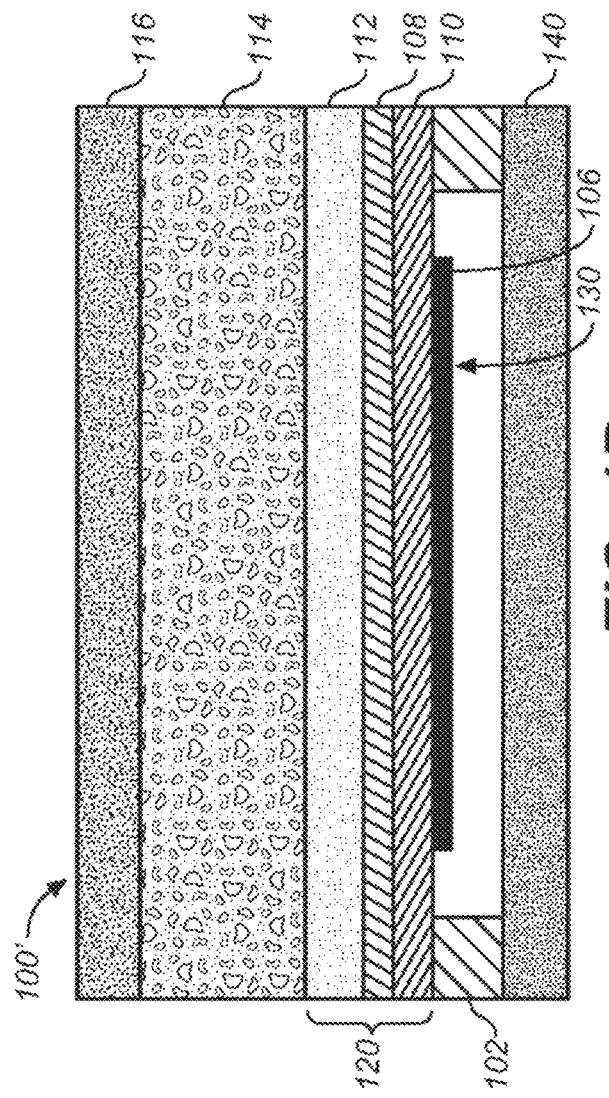
FIG. 1B is a diagram illustrating a PMUT device having an unpinned membrane, according to some embodiments.

FIG. 1B is identical to FIG. 1A in every way, except that the PMUT device 100' of FIG. 1B omits the interior support 104 and thus membrane 120 is not pinned (e.g., is "unpinned"). There may be instances in which an unpinned membrane 120 is desired. However, in other instances, a pinned membrane 120 may be employed.

Figure 2:
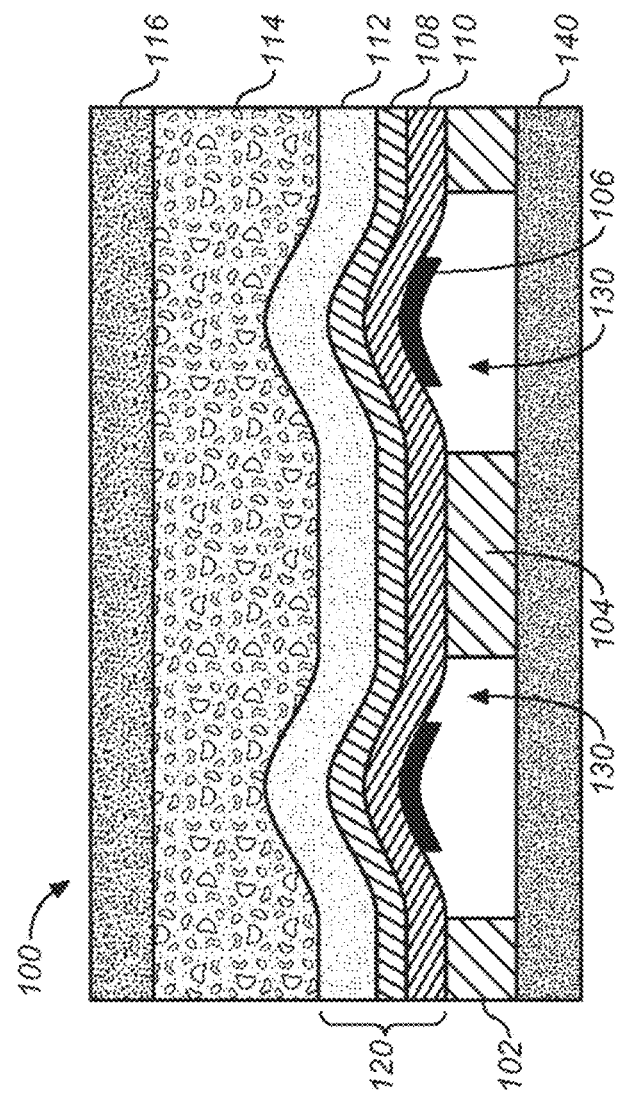
FIG. 2 is a diagram illustrating an example of membrane movement during activation of a PMUT device, according to some embodiments.

FIG. 2 is a diagram illustrating an example of membrane movement during activation of PMUT device 100, according to some embodiments. As illustrated with respect to FIG. 2, in operation, responsive to an object proximate platen layer 116, the electrodes 106 and 108 deliver a high frequency electric charge to the piezoelectric layer 110, causing those portions of the membrane 120 not pinned to the surrounding edge support 102 or interior support 104 to be displaced upward into the acoustic coupling layer 114. This generates a pressure wave that can be used for signal probing of the object. Return echoes can be detected as pressure waves causing movement of the membrane, with compression of the piezoelectric material in the membrane causing an electrical signal proportional to amplitude of the pressure wave.

The described PMUT device 100 can be used with almost any electrical device that converts a pressure wave into mechanical vibrations and/or electrical signals. In one aspect, the PMUT device 100 can comprise an acoustic sensing element (e.g., a piezoelectric element) that generates and senses ultrasonic sound waves. An object in a path of the generated sound waves can create a disturbance (e.g., changes in frequency or phase, reflection signal, echoes, etc.) that can then be sensed. The interference can be analyzed to determine physical parameters such as (but not limited to) distance, density and/or speed of the object. As an example, the PMUT device 100 can be utilized in various applications, such as, but not limited to, fingerprint or physiologic sensors suitable for wireless devices, industrial systems, automotive systems, robotics, telecommunications, security, medical devices, etc. For example, the PMUT device 100 can be part of a sensor array comprising a plurality of ultrasonic transducers deposited on a wafer, along with various logic, control and communication electronics. A sensor array may comprise homogenous or identical PMUT devices 100, or a number of different or heterogonous device structures.

In various embodiments, the PMUT device 100 employs a piezoelectric layer 110, comprised of materials such as, but not limited to, aluminum nitride (AlN), scandium doped aluminum nitride (ScAlN), lead zirconate titanate (PZT), quartz, polyvinylidene fluoride (PVDF), and/or zinc oxide, to facilitate both acoustic signal production and sensing. The piezoelectric layer 110 can generate electric charges under mechanical stress and conversely experience a mechanical strain in the presence of an electric field. For example, the piezoelectric layer 110 can sense mechanical vibrations caused by an ultrasonic beam and produce an electrical charge at the frequency (e.g., ultrasonic frequency) of the vibrations. Additionally, the piezoelectric layer 110 can generate an ultrasonic wave by vibrating in an oscillatory fashion that might be at the same frequency (e.g., ultrasonic frequency) as an input current generated by an alternating current (AC) voltage applied across the piezoelectric layer 110. It should be appreciated that the piezoelectric layer 110 can include almost any material (or combination of materials) that exhibits piezoelectric properties, such that the structure of the material does not have a center of symmetry and a tensile or compressive stress applied to the material alters the separation between positive and negative charge sites in a cell causing a polarization at the surface of the material. The polarization is directly proportional to the applied stress and is direction dependent so that compressive and tensile stresses results in electric fields of opposite polarizations.

Further, the PMUT device 100 comprises electrodes 106 and 108 that supply and/or collect the electrical charge to/from the piezoelectric layer 110. It should be appreciated that electrodes 106 and 108 can be continuous and/or patterned electrodes (e.g., in a continuous layer and/or a patterned layer). For example, as illustrated, electrode 106 is a patterned electrode and electrode 108 is a continuous electrode. As an example, electrodes 106 and 108 can be comprised of almost any metal layers, such as, but not limited to, Aluminum (Al)/Titanium (Ti), Molybdenum (Mo), etc., which are coupled with and on opposing sides of the piezoelectric layer 110. In one embodiment, PMUT device also includes a third electrode, as illustrated in FIG. 10 and described below.

According to an embodiment, the acoustic impedance of acoustic coupling layer 114 is selected to be similar to the acoustic impedance of the platen layer 116, such that the acoustic wave is efficiently propagated to/from the membrane 120 through acoustic coupling layer 114 and platen layer 116. As an example, the platen layer 116 can comprise various materials having an acoustic impedance in the range between 0.8 to 4 MRayl, such as, but not limited to, plastic, resin, rubber, Teflon, epoxy, etc. In another example, the platen layer 116 can comprise various materials having a high acoustic impedance (e.g., an acoustic impendence greater than 10 MRayl), such as, but not limited to, glass, aluminum-based alloys, sapphire, etc. Typically, the platen layer 116 can be selected based on an application of the sensor. For instance, in fingerprinting applications, platen layer 116 can have an acoustic impedance that matches (e.g., exactly or approximately) the acoustic impedance of human skin (e.g., $1.6 \times 10^6$ Rayl). Further, in one aspect, the platen layer 116 can further include a thin layer of anti-scratch material. In various embodiments, the anti-scratch layer of the platen layer 116 is less than the wavelength of the acoustic wave that is to be generated and/or sensed to provide minimum interference during propagation of the acoustic wave. As an example, the anti-scratch layer can comprise various hard and scratch-resistant materials (e.g., having a Mohs hardness of over 7 on the Mohs scale), such as, but not limited to sapphire, glass, MN, Titanium nitride (TiN), Silicon carbide (SiC), diamond, etc. As an example, PMUT device 100 can operate at 20 MHz and accordingly, the wavelength of the acoustic wave propagating through the acoustic coupling layer 114 and platen layer 116 can be 70-150 microns. In this example scenario, insertion loss can be reduced and acoustic wave propagation efficiency can be improved by utilizing an anti-scratch layer having a thickness of 1 micron and the platen layer 116 as a whole having a thickness of 1-2 millimeters. It is noted that the term "anti-scratch material" as used herein relates to a material that is resistant to scratches and/or scratch-proof and provides substantial protection against scratch marks.

In accordance with various embodiments, the PMUT device 100 can include metal layers (e.g., Aluminum (Al)/Titanium (Ti), Molybdenum (Mo), etc.) patterned to form electrode 106 in particular shapes (e.g., ring, circle, square, octagon, hexagon, etc.) that are defined in-plane with the membrane 120. Electrodes can be placed at a maximum strain area of the membrane 120 or placed at close to either or both the surrounding edge support 102 and interior support 104. Furthermore, in one example, electrode 108 can be formed as a continuous layer providing a ground plane in contact with mechanical support layer 112, which can be formed from silicon or other suitable mechanical stiffening material. In still other embodiments, the electrode 106 can be routed along the interior support 104, advantageously reducing parasitic capacitance as compared to routing along the edge support 102.

For example, when actuation voltage is applied to the electrodes, the membrane 120 will deform and move out of plane. The motion then pushes the acoustic coupling layer 114 it is in contact with and an acoustic (ultrasonic) wave is generated. Oftentimes, vacuum is present inside the cavity 130 and therefore damping contributed from the media within the cavity 130 can be ignored. However, the acoustic coupling layer 114 on the other side of the membrane 120 can substantially change the damping of the PMUT device 100. For example, a quality factor greater than 20 can be observed when the PMUT device 100 is operating in air with atmosphere pressure (e.g., acoustic coupling layer 114 is air) and can decrease lower than 2 if the PMUT device 100 is operating in water (e.g., acoustic coupling layer 114 is water).

Figure 3:
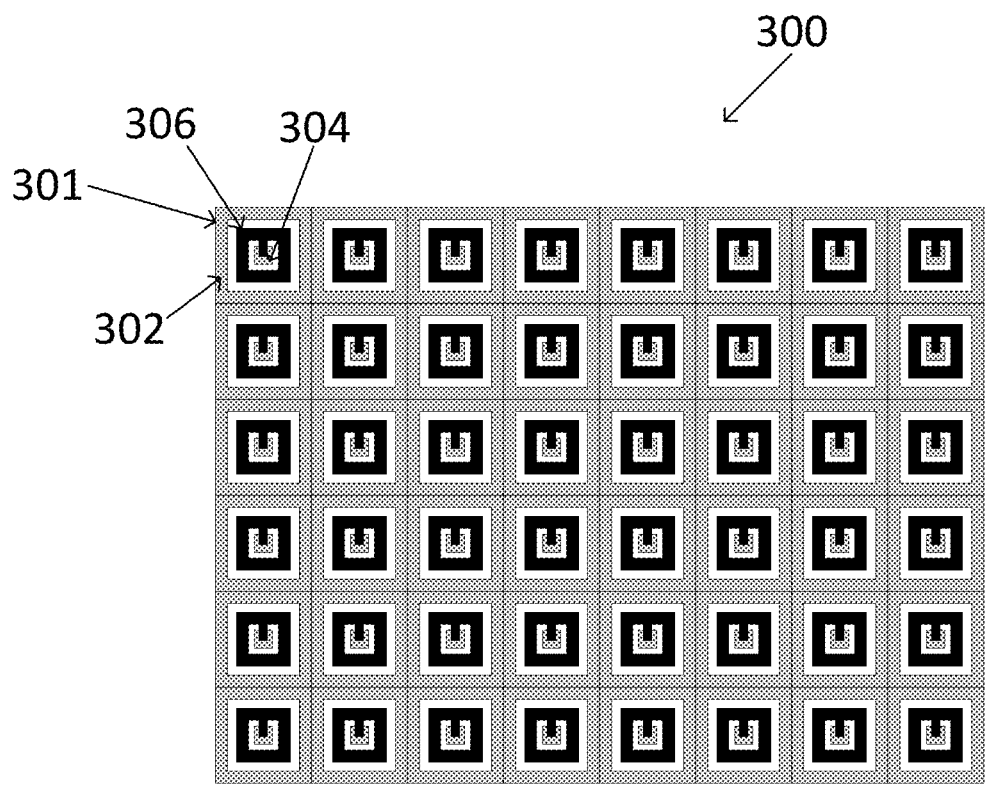
FIG. 3 illustrates an example array of square-shaped PMUT devices, according to some embodiments.

FIG. 3 illustrates an example two-dimensional array 300 of square-shaped PMUT devices 301 formed from PMUT devices having a substantially square shape similar to that discussed in conjunction with FIGS. 1A, 1B, and 2. Layout of square surrounding edge support 302, interior support 304, and square-shaped lower electrode 306 surrounding the interior support 304 are illustrated, while other continuous layers are not shown for clarity. As illustrated, array 300 includes columns of square-shaped PMUT devices 301 that are in rows and columns. It should be appreciated that rows or columns of the square-shaped PMUT devices 301 may be offset. Moreover, it should be appreciated that square-shaped PMUT devices 301 may contact each other or be spaced apart. In various embodiments, adjacent square-shaped PMUT devices 301 are electrically isolated. In other embodiments, groups of adjacent square-shaped PMUT devices 301 are electrically connected, where the groups of adjacent square-shaped PMUT devices 301 are electrically isolated.

In operation, during transmission, selected sets of PMUT devices in the two-dimensional array can transmit an acoustic signal (e.g., a short ultrasonic pulse) and during sensing, the set of active PMUT devices in the two-dimensional array can detect an interference of the acoustic signal with an object (in the path of the acoustic wave). The received interference signal (e.g., generated based on reflections, echoes, etc. of the acoustic signal from the object) can then be analyzed. As an example, an image of the object, a distance of the object from the sensing component, a density of the object, a motion of the object, etc., can all be determined based on comparing a frequency and/or phase of the interference signal with a frequency and/or phase of the acoustic signal. Moreover, results generated can be further analyzed or presented to a user via a display device (not shown).

Figure 4:
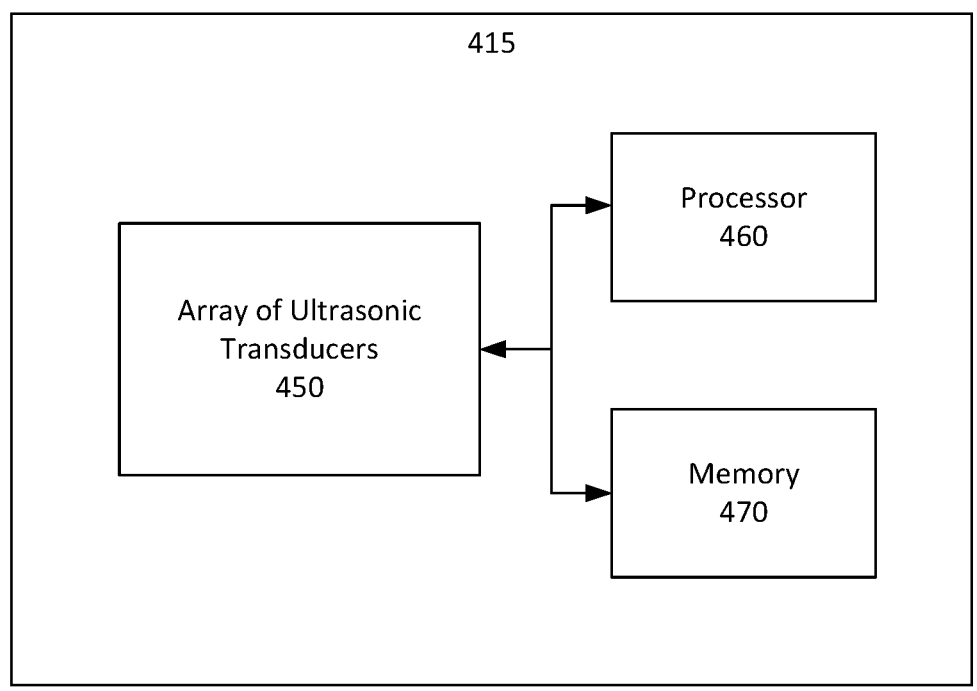
FIG. 4 illustrates an example fingerprint sensor, in accordance with various embodiments.

FIG. 4 illustrates an example fingerprint sensor 415, in accordance with various embodiments. In one embodiment, fingerprint sensor 415 includes an array 450 of ultrasonic transducers (e.g., PMUT devices), a processor 460, and a memory 470. It should be appreciated that some or all operations can be performed a processor external to fingerprint sensor 415 (e.g., a host processor or an application processor) In various embodiments, processor 460 performs certain operations in accordance with instructions stored within memory 470. It should be appreciated that components of fingerprint sensor 415 are examples, and that certain components, such as processor 460 and/or memory 470 may not be located within fingerprint sensor 415.

In one embodiment, fingerprint sensor 415 includes processor 460 for performing the pixel capture, where pixel capture is performed using subsets of ultrasonic transducers (e.g., PMUTs) of fingerprint sensor 415. In some embodiments, pixel capture for groups of pixels is handled the same, such that the groups of pixels utilize same imaging operations (e.g., utilize a same relative activation of the first subset of ultrasonic transducers and the second subset of ultrasonic transducers according to a same local angle). In other embodiments, processor 460 can perform at least some signal analysis, e.g., thresholding, to determine whether an object has interacted with fingerprint sensor 415. In other embodiments, processor 460 can analyze captured pixels and determine whether the object has characteristics of finger, e.g., a pattern resembling the ridge/valley pattern of a fingerprint. In other embodiments, processor 460 can capture an image of the fingerprint and forward it to a processor of system circuitry for further analysis.

In accordance with embodiments, processor 460 is configured to control the activation of the subsets of ultrasonic transducers to generate an ultrasonic signal, also referred to herein as an ultrasonic beam. Using multiple ultrasonic transducers, some of which are time delayed with respect to other ultrasonic transducers, embodiments described herein provide for focusing a transmit beam (e.g., forming a beam) of an ultrasonic signal to a desired point, allowing for high resolution sensing of a fingerprint, or other object. For instance, transmitting an ultrasonic signal from multiple PMUTs, where some PMUTs transmit at a time delay relative to other PMUTs, provides for focusing the ultrasonic beam to a contact point of a fingerprint sensing system (e.g., a top of a contact layer) for sensing a high resolution image of a pixel associated with the transmitting PMUTs. In some embodiments, the activation includes transmitting ultrasonic signals from a first group of ultrasonic transducers of the plurality of ultrasonic transducers, wherein at least some ultrasonic transducers of the first group of ultrasonic transducers are phase delayed with respect to other ultrasonic transducers of the first group of ultrasonic transducers, the first group of ultrasonic transducers for forming a focused ultrasonic beam. The activation also includes receiving reflected ultrasonic signals at a second group of ultrasonic transducers of the plurality of ultrasonic transducers.

While the embodiment of FIG. 4 includes processor 460 and memory 470, as described above, it should be appreciated that various functions of processor 460 and memory 470 may reside in other components of an electronic device. Moreover, it should be appreciated that processor 460 may be any type of processor for performing any portion of the described functionality (e.g., custom digital logic).

Example Ultrasonic Sensor Having a Transmission Frequency Tuned to a Matching Layer Fingerprint sensors are used in electronic devices for user authentication, such as mobile electronic devices, building locks, automobile locks, etc. In many situations, the surface area of the fingerprint sensor needs to be as flat and as uniform as possible in order to obtain a good fingerprint. However, in some situation it may be desirable to have a non-flat or non-uniform fingerprint surface. For example, when a fingerprint sensor is mounted on the back of a mobile phone, a concave form or structured surface may help guide the user's finger to the correct position on the FP sensor. In other situations, the design employs a non-flat form factor, such as a convex button, a rounded door knob or automobile handle. The design may also employ cover materials of different hardness, such as stainless steel, plastic, ceramic, aluminum, etc. Some designs may require a smooth surface, while other designs may require a rough or textured surface. In further situations, the fingerprint sensor may be integrated in a wearable device, e.g., a smart watch, either on the face of the watch (e.g., behind the display), or on the side of the body. While in the former placement the surface can be relatively flat, in the latter placement the sensor surface may have a small radius of curvature. In general, the smaller the device, or section of the device, where the sensor is integrated, the smaller the radius of curvature, i.e., the more curved the surface is.

Embodiments described herein provide a sensor device including a two-dimensional array of ultrasonic transducers, a contact layer, a matching layer between the two-dimensional array and the contact layer, where the matching layer has a uniform or non-uniform thickness, and an array controller configured to control activation of ultrasonic transducers during an imaging operation for imaging a plurality of pixels within the two-dimensional array of ultrasonic transducers. In some embodiments, the matching layer is an adhesive layer for bonding the two-dimensional array of ultrasonic transducers to the contact layer. During the imaging operation, the array controller is configured to activate different subsets of ultrasonic transducers associated with different regions of the two-dimensional array of ultrasonic transducers at different transmission frequencies, where the different frequencies are determined such that a thickness of the matching layer at a region is substantially equal to a quarter wavelength of the first transmission frequency for the region. The array controller is also configured to combine the plurality of pixels into a compound fingerprint image that compensates for the non-uniform thickness of the matching layer.

Although embodiments are described with respect to an array of ultrasonic transducers, the methods and techniques may be applied to other ultrasound sensing architectures where the control of the operating parameters of different segments of the sensors can be adjusted separately to correct for the non-uniform thickness of the matching layer. Moreover, the methods and techniques may be applied to ultrasonic sensors having matching layers of uniform thickness.

Figure 5A:
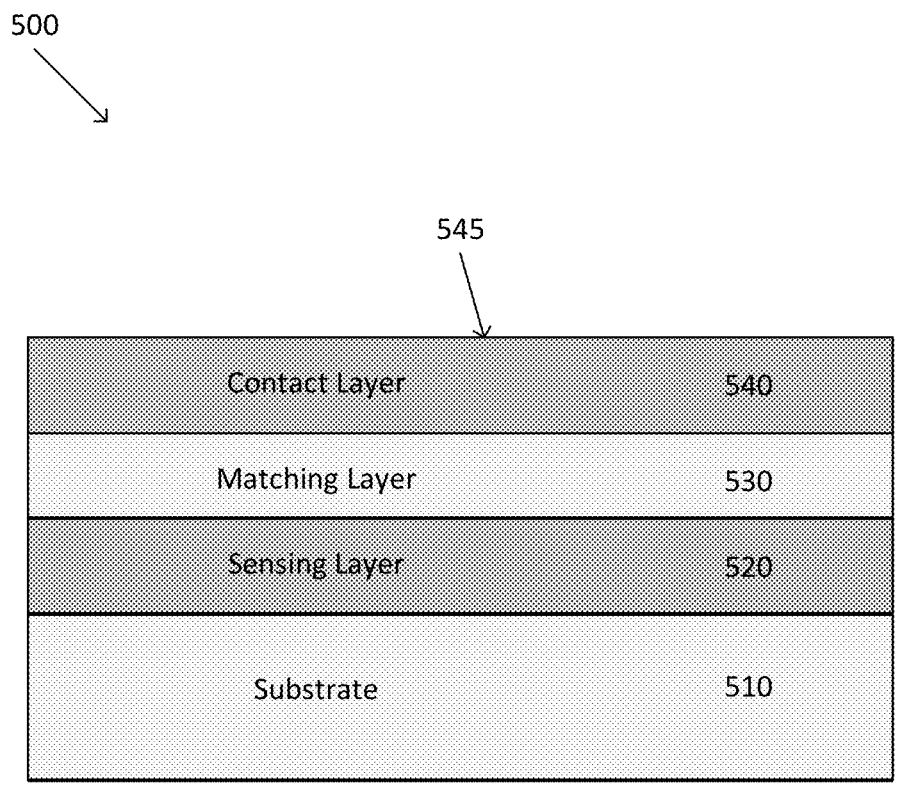
FIGS. 5A and 5B illustrate cross section views of ultrasonic fingerprint sensors having matching layers of uniform thickness, according to embodiments.
Figure 5B:
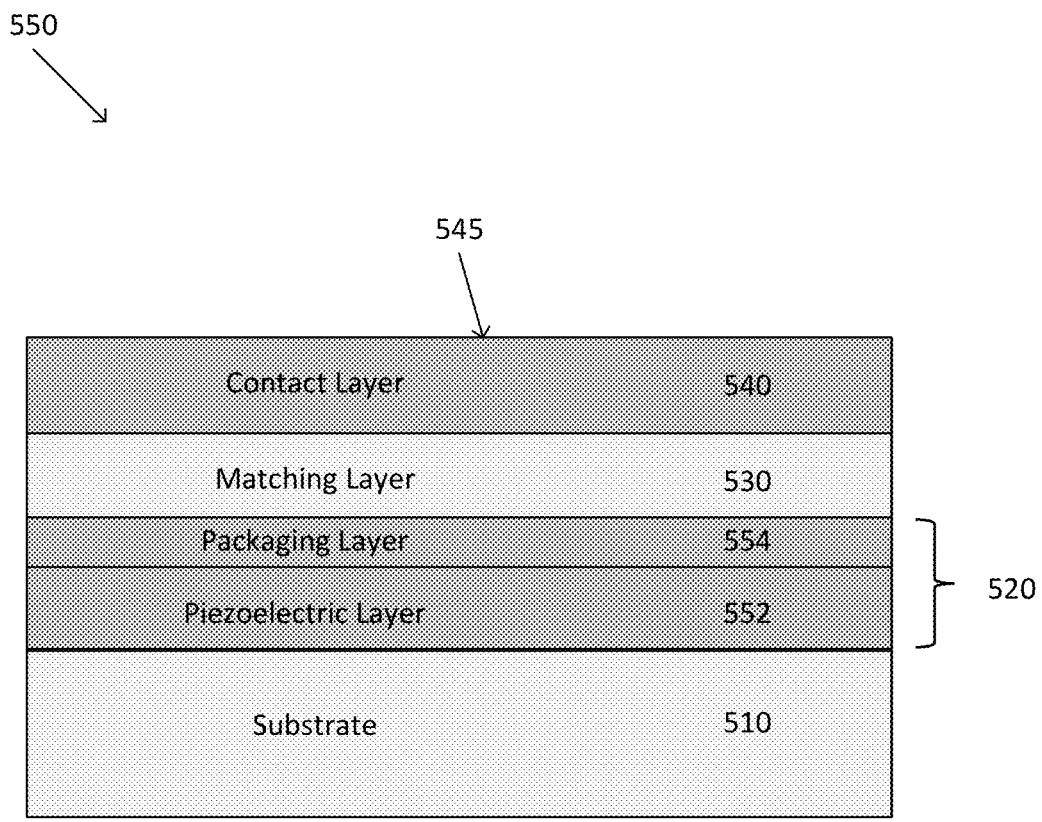

FIGS. 5A and 5B illustrate cross section views of ultrasonic fingerprint sensors having matching layers of uniform thickness, according to embodiments. FIG. 5A illustrates a cross section view of an ultrasonic fingerprint sensor 500, according to an embodiment. As illustrated, ultrasonic fingerprint sensor 500 includes several different layers. Ultrasonic fingerprint sensor 500 includes an active sensing layer 520 on top of a substrate 510. The active sensing layer 520 may use various techniques to sense or detect the fingerprint, e.g., acoustic or ultrasonic techniques. It should be appreciated that active sensing layer 520 may not extend to the edges of contact layer 530. For an ultrasonic fingerprint sensor, the sensing layer may comprise an array of ultrasonic transducers (e.g., PMUTs 100 of FIG. 1A, PMUTs 100' of FIG. 1B), or bulk piezo actuator elements, or piezoelectric film (e.g., PVDF) that may be used emit and detect ultrasonic waves. In some embodiments, sensing layer 520 includes a transmission layer for transmitting ultrasonic signals and a detection layer for receiving reflected ultrasonic signals. Matching layer 530 overlays sensing layer 520. Contact layer 540 overlays matching layer 530, where the outer surface of contact layer 540 is contact surface 545. In some embodiments, matching layer 530 is an adhesive layer (e.g., an epoxy) for bonding contact layer 540 to sensing layer 520. Contact surface 545 of contact layer 540 is substantially flat and parallel to sensing layer 520. For example, a user using ultrasonic fingerprint sensor 500 places his or her finger in contact with contact surface 545.

In some embodiments, other layers such as display devices, (not shown) may be used between sensing layer 520 and contact layer 540, above or below matching layer 530. In some embodiments, matching layer 530 is an acoustic coupling layer. It should be appreciated that in some embodiments, contact layer 540 and the acoustic coupling layer are a single layer. It should be further appreciated that ultrasonic fingerprint sensor 500 may include other layers, such as other bonding layers and laminate layers, and is not intended to be limited to the specific layers shown. In other embodiments, an ultrasonic fingerprint sensor including separate signal transmission and signal detection layers may be used (e.g., within sensing layer 520).

In an ultrasonic fingerprint sensor 500, the acoustic waves travel from the sensing layer 520 through matching layer 530 and contact layer 540 to contact surface 545, interact with the object on the surface (e.g., a finger), and may then be reflected back to the sensing layer 520, thereby again traversing matching layer 530 and contact layer 540. In some embodiments, matching layer 530 has an acoustic impedance between an acoustic impedance of sensing layer 520 and an acoustic impedance of contact layer 540. In some embodiments, matching layer 530 has a hardness between a hardness of sensing layer 520 and a hardness of contact layer 540. In some embodiments, a thickness of matching layer 530 is substantially equal to a quarter wavelength (or N wavelengths plus a quarter wavelength, where N is an integer) of the transmission frequency of sensing layer 520. Matching layer 530 operates as an acoustic coupling layer between sensing layer 520 and contact layer 540. Embodiments herein aim to optimize the transmission signal and reflection signal to provide a high signal through contact layer 540. In some embodiments, a thickness of matching layer 530 is substantially equal to a quarter wavelength of the transmission frequency of sensing layer 520 plus or minus a one-eighth wavelength of the transmission frequency.

FIG. 5B illustrates a cross section view of an ultrasonic fingerprint sensor 550, according to another embodiment. Ultrasonic fingerprint sensor 550 operates in a similar manner to, and includes the components of, ultrasonic fingerprint sensor 500 of FIG. 5A, with the exception of the composition of sensing layer 520. As illustrated, sensing layer 520 includes piezoelectric layer 552 and packaging layer 554 overlaying piezoelectric layer 552. In some embodiments, sensing layer 520 is a packaged sensing device such that packaging layer 554 is a packaging epoxy overlaying piezoelectric layer 552. In some embodiments, piezoelectric layer 552 includes a two-dimensional array of ultrasonic transducers (e.g., PMUTs 100 of FIG. 1A, PMUTs 100' of FIG. 1B, or bulk piezo actuator elements). In some embodiments, packaging layer 554 is an epoxy, also referred to as a packaging epoxy. Packaging layer 554 overlaying piezoelectric layer 552 is an example of a packaged ultrasonic sensor, where the piezoelectric layer 552 (e.g., a two-dimensional array of ultrasonic transducers) is packaged into a sensor unit by sealing piezoelectric layer 552 with packaging layer 554. It should be appreciated that a sensing layer including a packaging layer overlaying a piezoelectric layer can be utilized in the other embodiments of ultrasonic sensors described herein.

Referring back now to FIGS. 1A, 1B, 5A, and 5B, and matching layer 530 (e.g., acoustic coupling layer 114). Acoustic coupling layer 114 and matching layer 530 may have different thicknesses depending on the application, and the material may be selected to help transmit acoustic energy from the sensing layer 520 to contact layer 540. In some embodiments, the thickness of matching layer 530 may be selected to increase the coupling of acoustic energy into contact layer 540. For example, matching layer 530 may have a thickness of approximately a quarter (¼) wavelength, also referred to as a quarter lambda layer or quarter wavelength layer. Although the term quarter wavelength layer is used, the layer may also be thicker as long as it is an $n^{th}$ order quarter wavelength, meaning any integer value+quarter lambda. Internal reflection and constructive interference effects may then increase the transmitted acoustic energy into the contact layer.

In embodiments where a quarter wavelength layer is used, the thickness of the layer may have to be tuned depending on the frequency of the acoustic waves and the speed of sound of the material. For example, take matching layer 530 made of epoxy with a speed of sound of 2700 m/s. At an acoustic frequency of 50 Mhz, the matching layer 530 should have a thickness of approximately 13.5 µm. Care should be taken that the thickness variation of the acoustic coupling layer is not too large to have an opposite effect of destructive interference. Destructive interference occurs when the layer thickness is close the half (½) wavelength. This means that the tolerance of the quarter wavelength layer thickness is one-eight (⅛) wavelength. If the difference in thickness is larger, negative destructive interference effects start to occur. In the above example, the one eighth wavelength is approximately 7 µm, which means that the thickness variation in the 13.5 µm layer should not be more than plus or minus 7 µm. In situations and devices where the thickness of the matching layer 530 cannot be controlled to within the desired specification, the wavelength can be adapted through frequency tuning to obtain the constructive interference effects of the quarter wavelength layer.

In some embodiments, the frequency of the acoustic waves is adapted to the local thickness of the matching layer 530, or any other layer used for creating constructive interference. Frequency grouping maps similar to those described in relation to FIGS. 9A through 9D below may be used for this purpose. The frequency for each transducer or group of transducers may be determined in a calibration phase, where the frequency is varied and the effect on the signal strength is observed. As the frequency is varied, the signal will go through maxima and minima, corresponding to quarter wavelength and half wavelength effects, respectively. A frequency corresponding to a maximum may then be selected for optimum quarter wavelength effect. The use of the quarter wavelength layer may be used with flat surface or surfaces of non-uniform thickness. The use of the quarter wavelength layer may be especially important in combination with materials with a large acoustic impedance mismatch, e.g., stainless steel.

Figure 6A:
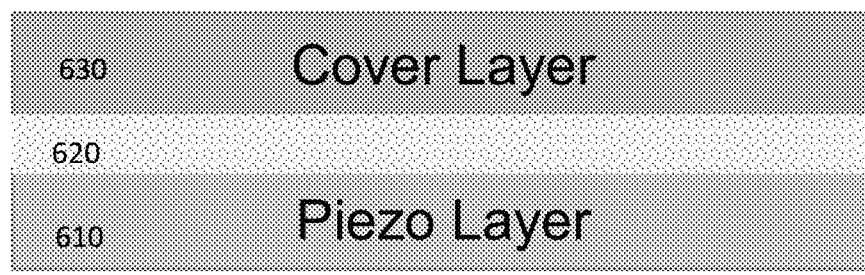
FIG. 6A illustrates a cross section view of an ultrasonic fingerprint sensor having a matching layer of uniform thickness, according to an embodiment.

FIG. 6A illustrates a cross section view of an ultrasonic fingerprint sensor 600 having a matching layer 620 of uniform thickness, according to an embodiment. Ultrasonic fingerprint sensor 600 includes cover layer 630 over piezoelectric layer 610, where matching laying 620 is between cover layer 630 over piezoelectric layer 610. In some embodiments, matching layer 620 is an adhesive layer (e.g., an epoxy) for bonding cover layer 630 to piezoelectric layer 610. As illustrated, matching layer 620 has a thickness that is substantially equal to a quarter wavelength of the transmission frequency of piezoelectric layer 610.

Figure 6B:
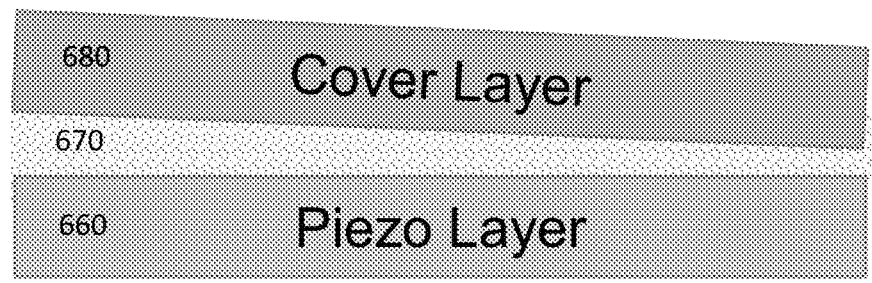
FIG. 6B illustrates a cross section view of an ultrasonic fingerprint sensor having a matching layer of non-uniform thickness, according to an embodiment.

FIG. 6B illustrates a cross section view of an ultrasonic fingerprint sensor 650 having a matching layer 670 of non-uniform thickness, according to an embodiment. Ultrasonic fingerprint sensor 650 includes cover layer 680 over piezoelectric layer 660, where matching laying 670 is between cover layer 680 over piezoelectric layer 660. In some embodiments, matching layer 670 is an adhesive layer (e.g., an epoxy) for bonding cover layer 680 to piezoelectric layer 660.

As illustrated, matching layer 670 has a non-uniform thickness. In accordance with various embodiments, piezoelectric layer 660 is operable to transmit at different frequencies associated with different regions of thickness of matching layer 670, where a thickness at each region is substantially equal to a quarter wavelength of the transmission frequency of piezoelectric layer 660. In some embodiments, the thickness at each region is substantially equal to a quarter wavelength of the transmission frequency of piezoelectric layer 660 plus or minus a one-eighth wavelength (or the required accuracy) of the transmission frequency at the region. It should be appreciated that ultrasonic fingerprint sensor 650 can have any number of transmission regions of piezoelectric layer 660, ranging from individual transducers to large regions of transducers. While matching layer 670 is shown as having various thickness at the two-dimensional cross section view, it should be appreciated that matching layer 670 can have varying frequency over the entire three-dimensional volume of matching layer 620.

Figure 7A:
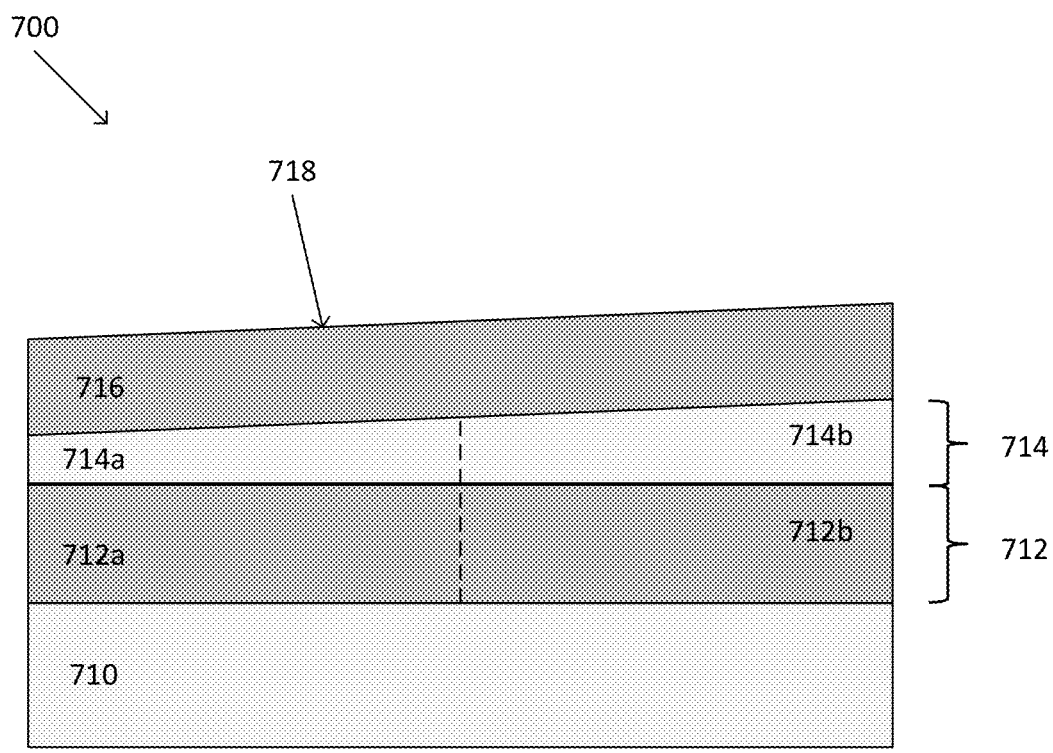
FIGS. 7A, 7B, and 7C illustrate cross section views of ultrasonic fingerprint sensors having matching layers of non-uniform thickness, according to embodiments.
Figure 7B:
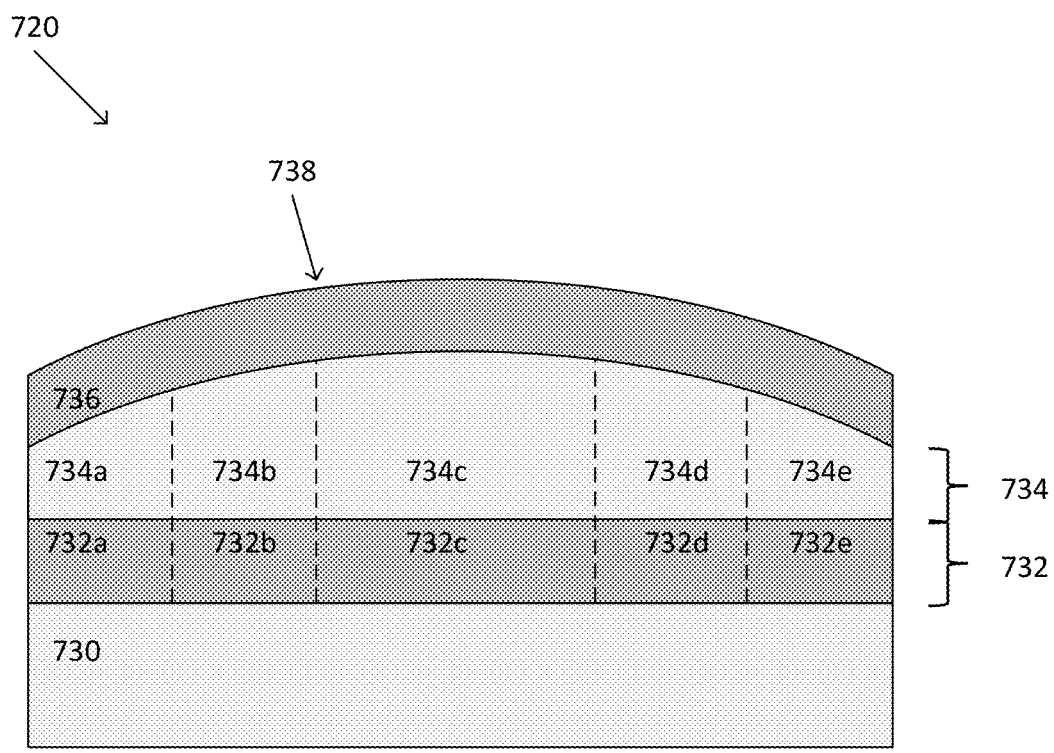
Figure 7C:
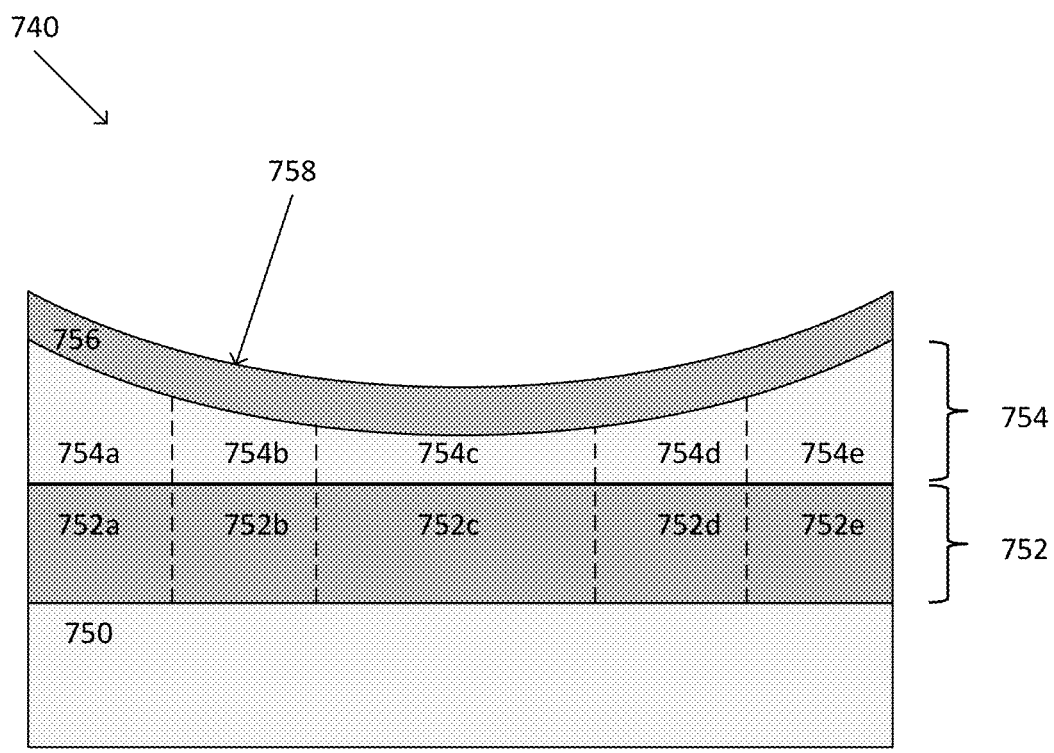

FIGS. 7A, 7B, and 7C illustrate cross section views of ultrasonic fingerprint sensors having matching layers of non-uniform thickness, according to embodiments. FIG. 7A illustrates a cross section view of ultrasonic fingerprint sensor 700 having a matching layer 714 of linear non-uniform thickness, according to an embodiment. As illustrated, ultrasonic fingerprint sensor 700 includes an active sensing layer 712 on top of a substrate 710, matching layer 714 on top of sensing layer 712, and contact layer 716 on top of matching layer 714. In some embodiments, sensing layer 712 may comprise an array of ultrasonic transducers (e.g., PMUTs 100 of FIG. 1A, PMUTs 100' of FIG. 1B, or bulk piezo actuator elements) that may be used emit and detect ultrasonic waves. In some embodiments, matching layer 714 is an adhesive layer (e.g., an epoxy) for bonding contact layer 716 to sensing layer 712. Contact layer 716 has contact surface 718. For example, a user using ultrasonic fingerprint sensor 700 places his or her finger in contact with contact surface 718.

As illustrated, matching layer 714 includes two regions 714a and 714b, where the thickness of each region 714a and 714b is within a tolerance range of a quarter wavelength, or substantially a quarter wavelength, of the transmission frequency of each corresponding region 712a and 712b of sensing layer 712. In some embodiments, the thickness at each corresponding region 714a and 714b is substantially equal to a quarter wavelength of the transmission frequency of the corresponding region 712a and 712b of sensing layer 712 plus or minus a one-eighth wavelength of the transmission frequency at the region (e.g., a range of a quarter wavelength plus or minus a one-eighth wavelength of the transmission frequency). In some embodiments, the transmission frequency is tuned such that a quarter wavelength of the transmission frequency is substantially equal to a thickness of regions 714a and 714b. The thickness of region 714a of matching layer 714 is substantially equal to a quarter wavelength of the transmission frequency of corresponding region 712a of sensing layer 712 and the thickness of region 714b of matching layer 714 is substantially equal to a quarter wavelength of the transmission frequency of corresponding region 712b of sensing layer 712, such that the thickness of region 714a is different than regions 714b.

It should be appreciated that the slope of matching layer 714 may dictate or influence the number of different regions of matching layer 714, and that the two regions 714a and 714b of matching layer 714 are examples. The number of different regions may vary based on the tolerance for accuracy, the slope of the linear non-uniform thickness, the number of available transmission frequencies, the control of the available transmission frequencies, the applications utilizing the fingerprint sensor, etc. For example, where a system has a certain number of adjustable or selectable transmission frequencies, embodiments herein are configured to group ultrasonic transducers to best fit the available transmission frequencies, within an acceptable tolerance, into regions of sensing layer 712, corresponding to the regions of matching layer 714.

FIG. 7B illustrates a cross section view of ultrasonic fingerprint sensor 720 having a matching layer 734 of convex non-uniform thickness, according to an embodiment. As illustrated, ultrasonic fingerprint sensor 720 includes an active sensing layer 732 on top of a substrate 730, matching layer 734 on top of sensing layer 732, and contact layer 736 on top of matching layer 734. In some embodiments, sensing layer 732 may comprise an array of ultrasonic transducers (e.g., PMUTs 100 of FIG. 1A, PMUTs 100' of FIG. 1B, or bulk piezo actuator elements) that may be used emit and detect ultrasonic waves. In some embodiments, matching layer 734 is an adhesive layer (e.g., an epoxy) for bonding contact layer 736 to sensing layer 732. Contact layer 736 has contact surface 738. For example, a user using ultrasonic fingerprint sensor 720 places his or her finger in contact with contact surface 738.

As illustrated, matching layer 734 includes five regions 734a through 734e, where the thickness of each region 734a through 734e is substantially equal to a quarter wavelength of the transmission frequency of each corresponding region 732a through 732e of sensing layer 732. In some embodiments, the thickness at each corresponding region 734a through 734e is substantially equal to a quarter wavelength of the transmission frequency of the corresponding region 732a through 732e of sensing layer 732 plus or minus a one-eighth wavelength of the transmission frequency at the region (e.g., a range of a quarter wavelength plus or minus a one-eighth wavelength of the transmission frequency). As illustrated, the thickness of region 734a of matching layer 734 is substantially equal to a quarter wavelength of the transmission frequency of corresponding region 732a of sensing layer 732, the thickness of region 734b of matching layer 734 is substantially equal to a quarter wavelength of the transmission frequency of corresponding region 732b of sensing layer 732, the thickness of region 734c of matching layer 734 is substantially equal to a quarter wavelength of the transmission frequency of corresponding region 732c of sensing layer 732, the thickness of region 734d of matching layer 734 is substantially equal to a quarter wavelength of the transmission frequency of corresponding region 732d of sensing layer 732, and the thickness of region 734e of matching layer 734 is substantially equal to a quarter wavelength of the transmission frequency of corresponding region 732e of sensing layer 732. It should be appreciated that the thickness of at least two regions 734a through 734e are different. As illustrated, the thickness of regions 734a and 734e are substantially equal and the thickness of regions 734b and 734d are substantially equal.

It should be appreciated that the slope or curve of matching layer 734 may dictate or influence the number of different regions of matching layer 734, and that the five regions 734a through 734b of matching layer 734 are examples. The number of different regions may vary based on the tolerance for accuracy, the slope of the convex non-uniform thickness, the number of available transmission frequencies, the control of the available transmission frequencies, the applications utilizing the fingerprint sensor, etc. For example, where a system has a certain number of adjustable or selectable transmission frequencies, embodiments herein are configured to group ultrasonic transducers to best fit the available transmission frequencies, within an acceptable tolerance, into regions of sensing layer 732, corresponding to the regions of matching layer 734.

FIG. 7C illustrates a cross section view of ultrasonic fingerprint sensor 740 having a matching layer 754 of concave non-uniform thickness, according to an embodiment. As illustrated, ultrasonic fingerprint sensor 740 includes an active sensing layer 752 on top of a substrate 750, matching layer 754 on top of sensing layer 752, and contact layer 756 on top of matching layer 754. In some embodiments, sensing layer 752 may comprise an array of ultrasonic transducers (e.g., PMUTs 100 of FIG. 1A, PMUTs 100' of FIG. 1B, or bulk piezo actuator elements) that may be used emit and detect ultrasonic waves. In some embodiments, matching layer 754 is an adhesive layer (e.g., an epoxy) for bonding contact layer 756 to sensing layer 752. Contact layer 756 has contact surface 758. For example, a user using ultrasonic fingerprint sensor 740 places his or her finger in contact with contact surface 758.

As illustrated, matching layer 754 includes five regions 754a through 754e, where the thickness of each region 754a through 754e is substantially equal to a quarter wavelength of the transmission frequency of each corresponding region 752a through 752e of sensing layer 752. In some embodiments, the thickness at each corresponding region 754a through 754e is substantially equal to a quarter wavelength of the transmission frequency of the corresponding region 752a through 752e of sensing layer 752 plus or minus a one-eighth wavelength of the transmission frequency at the region (e.g., a range of a quarter wavelength plus or minus a one-eighth wavelength of the transmission frequency). As illustrated, the thickness of region 754a of matching layer 754 is substantially equal to a quarter wavelength of the transmission frequency of corresponding region 752a of sensing layer 752, the thickness of region 754b of matching layer 754 is substantially equal to a quarter wavelength of the transmission frequency of corresponding region 752b of sensing layer 752, the thickness of region 754c of matching layer 754 is substantially equal to a quarter wavelength of the transmission frequency of corresponding region 752c of sensing layer 752, the thickness of region 754d of matching layer 754 is substantially equal to a quarter wavelength of the transmission frequency of corresponding region 752d of sensing layer 752, and the thickness of region 754e of matching layer 754 is substantially equal to a quarter wavelength of the transmission frequency of corresponding region 752e of sensing layer 752. It should be appreciated that the thickness of at least two regions 754a through 754e are different. As illustrated, the thickness of regions 754a and 754e are substantially equal and the thickness of regions 754b and 754d are substantially equal.

It should be appreciated that the slope or curve of matching layer 754 may dictate or influence the number of different regions of matching layer 754, and that the five regions 754a through 754b of matching layer 754 are examples. The number of different regions may vary based on the tolerance for accuracy, the slope of the concave non-uniform thickness, the number of available transmission frequencies, the control of the available transmission frequencies, the applications utilizing the fingerprint sensor, etc. For example, where a system has a certain number of adjustable or selectable transmission frequencies, embodiments herein are configured to group ultrasonic transducers to best fit the available transmission frequencies, within an acceptable tolerance, into regions of sensing layer 752, corresponding to the regions of matching layer 754.

Figure 8:
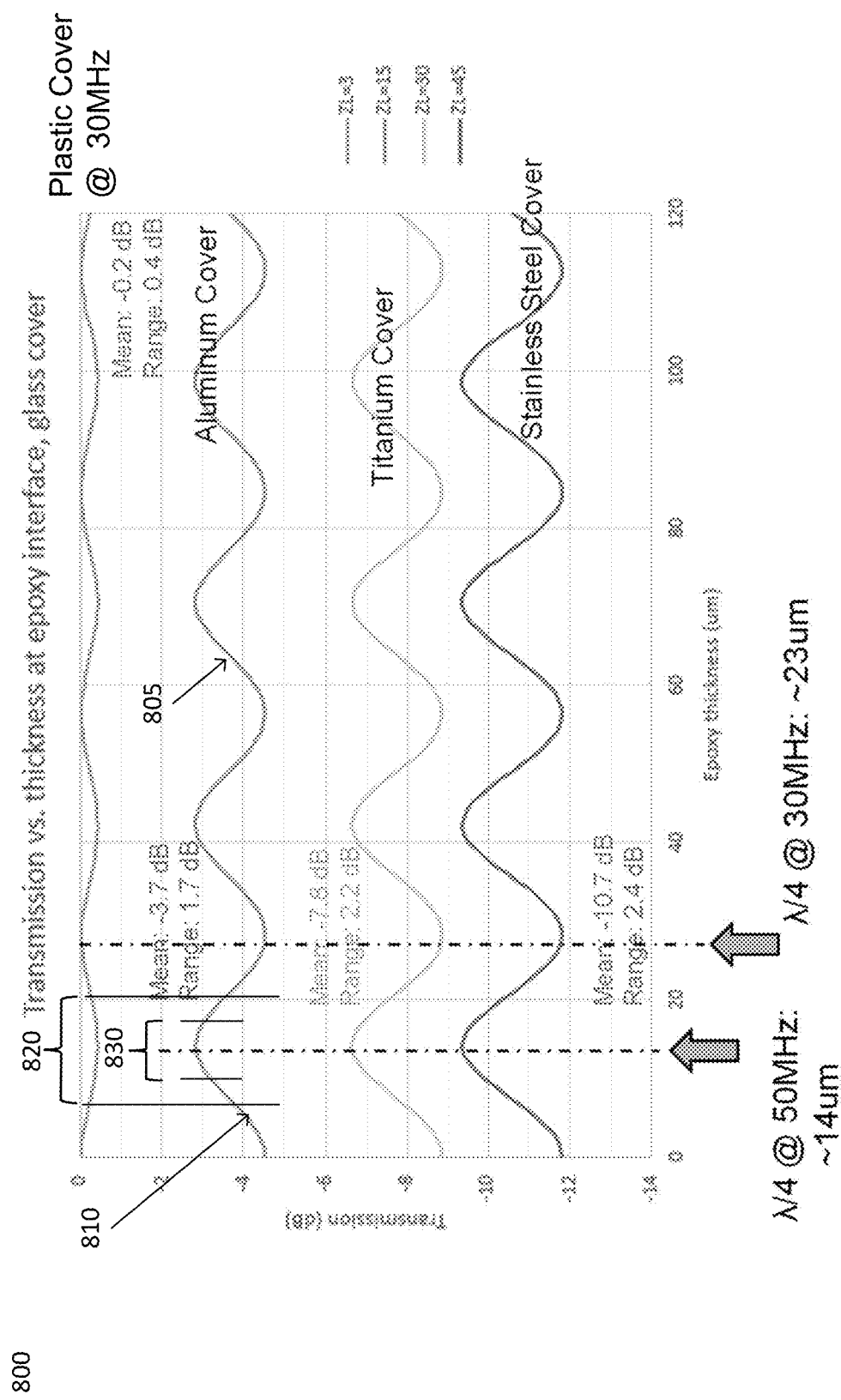
FIG. 8 illustrates an example graph of transmission versus matching layer thickness of an ultrasonic fingerprint sensor for different materials, according to embodiments.

In some embodiments, the frequency of the acoustic waves is adapted to the local thickness of the matching layer, or any other layer used for creating constructive interference. Frequency grouping maps similar to those described in relation to FIGS. 9A through 9D may be used for this purpose. The frequency for each transducer or group of transducers may be determined in a calibration phase, where the frequency is varied and the effect on the signal strength is observed. As the frequency is varied, the signal will go through maxima and minima, corresponding to quarter wavelength and half wavelength effects, respectively. A frequency corresponding to a maximum may then be selected for optimum quarter wavelength effect, e.g., as illustrated in FIG. 8. The use of the quarter wavelength layer may be used with flat surface or surfaces of non-uniform thickness. The use of the quarter wavelength layer may be especially important in combination with materials with a large acoustic impedance mismatch, such as e.g. stainless steel FIG. 8 illustrates an example graph 800 of transmission versus matching layer thickness of an ultrasonic fingerprint sensor for different contact layer materials, according to embodiments. Graph 800 illustrates that for various contact layer materials (e.g., aluminum, titanium, and stainless steel), the transmission frequency signal is highest at a matching layer having a thickness of a quarter wavelength of the transmission frequency. For example, an aluminum cover has an impedance $Z_L$ of approximately 15. At a transmission frequency of 50 MHz, as shown at line 805, the thickness of a matching layer that provides the highest signal is approximately 14 µm, as indicated by arrow 810 (as well as approximately 42 µm, approximately 70 µm, etc.) This highest signal at approximately 14 µm corresponds to substantially a quarter wavelength of the transmission frequency of 50 MHz. Moreover, as can be seen in FIG. 8, the thickness of a matching layer that provides the highest signal is also approximately 14 µm for titanium and stainless steel covers. While the signal strength varies for all cover materials (e.g., based on material acoustic impedance), the thickness of the matching layer for a given transmission frequency is the same.

As can be seen in graph 800 at range 820, the thickness of a matching layer that provides the highest signal is approximately 14 µm, the range 820 at which a signal strength is at or close to the highest is substantially a quarter wavelength plus or minus a one-eighth wavelength of the transmission frequency. Beyond range 820, at the flexion point of the curve, the signal strength decreases. In some embodiment, a narrower range 830 is used (e.g., a quarter wavelength plus or minus a one-sixteenth wavelength of the transmission frequency) for providing an smaller tolerance of signal.

In some embodiments, the thickness of the matching layer is selected based on the transmission frequency of the underlying sensor and the cover material. In some embodiments, the transmission frequency is tuned according to the thickness of the matching layer that provides the highest signal. In some embodiments, a thickness of a matching layer is selected based on a desired transmission frequency, and the transmission frequency is then tuned or slightly adjusted to achieve a transmission frequency where the thickness is substantially equal to a quarter wavelength. This then compensates for the fact that the actual thickness may not be exactly equal to the desired thickness.

FIGS. 9A, 9B, 9C, and 9D illustrate examples of transmission frequency regions for use by ultrasonic transducers of an ultrasonic fingerprint sensor underlying a matching layer of non-uniform thickness, according to embodiments. As the thickness of the matching layer varies over the surface of the ultrasonic sensor layer, different regions of the matching layer correspond to different transmission frequencies for the underlying ultrasonic transducers for generating ultrasonic signals that have the highest signal strength. It should be appreciated that the regions can cover a range of signal strengths corresponding to a quarter wavelength plus or minus a one-eighth wavelength of the transmission frequency. The grouping of ultrasonic transducers into regions allows for the collective control of ultrasonic transducers, and is useful in selecting regions where the tolerance of the signal strength can be collectively controlled within the appropriate signal strength range.

Figure 9A:
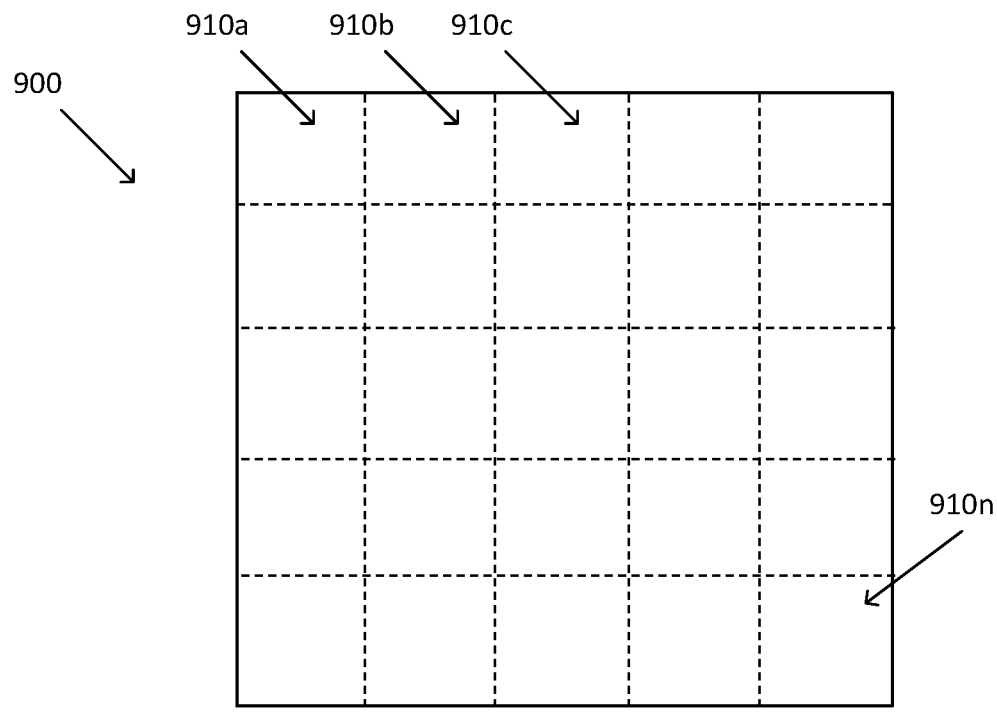
FIGS. 9A, 9B, 9C, and 9D illustrate examples of transmission frequency regions for use by an ultrasonic fingerprint sensor underlying a matching layer of non-uniform thickness, according to embodiments.

FIG. 9A illustrates an example of block transmission frequency regions 910a through 910n (generically referred to as a region 910) for use by an ultrasonic fingerprint sensor 900 underlying a matching layer of non-uniform thickness, according to an embodiment. As illustrated, ultrasonic fingerprint sensor 900 has 5×5 regions having varying transmission frequencies. It should be appreciated that a region 910 can include one or more ultrasonic transducers. It should also be appreciated that some regions 910 can have the same operating transmission frequency of ultrasonic transducers. Although the regions are shown with substantially equivalent sizes, the size of the different regions may vary, depending on the thickness of the matching layer and/or selected frequencies.

Figure 9B:
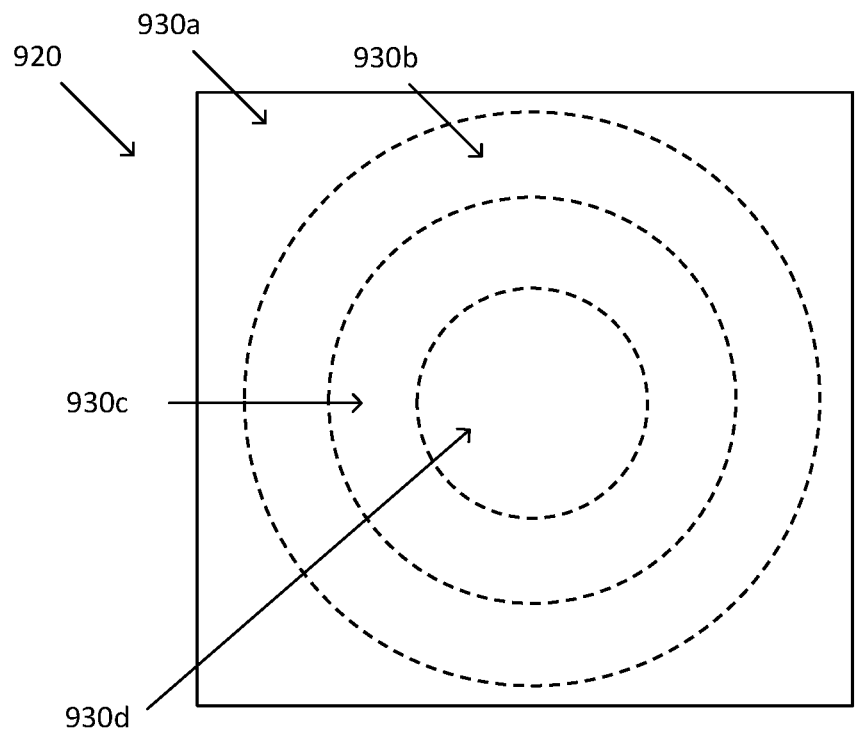

FIG. 9B illustrates an example of ring-shaped transmission frequency regions 930a through 930n (generically referred to as a region 930) for use by an ultrasonic fingerprint sensor 920 underlying a matching layer of non-uniform thickness, according to an embodiment. For example, ring-shaped transmission frequency regions 930 of FIG. 9B may be used in a dimple or curved (e.g., concave or convex) shaped matching layer. As illustrated, ultrasonic fingerprint sensor 920 four regions having varying transmission frequencies where region 930d is circular, regions 930b and 930c are ring-shaped, and region 930a is square shaped with a circular cutout. It should be appreciated that a region 930 can include one or more ultrasonic transducers. It should also be appreciated that some regions 930 can have the same operating transmission frequency of ultrasonic transducers.

Figure 9C:
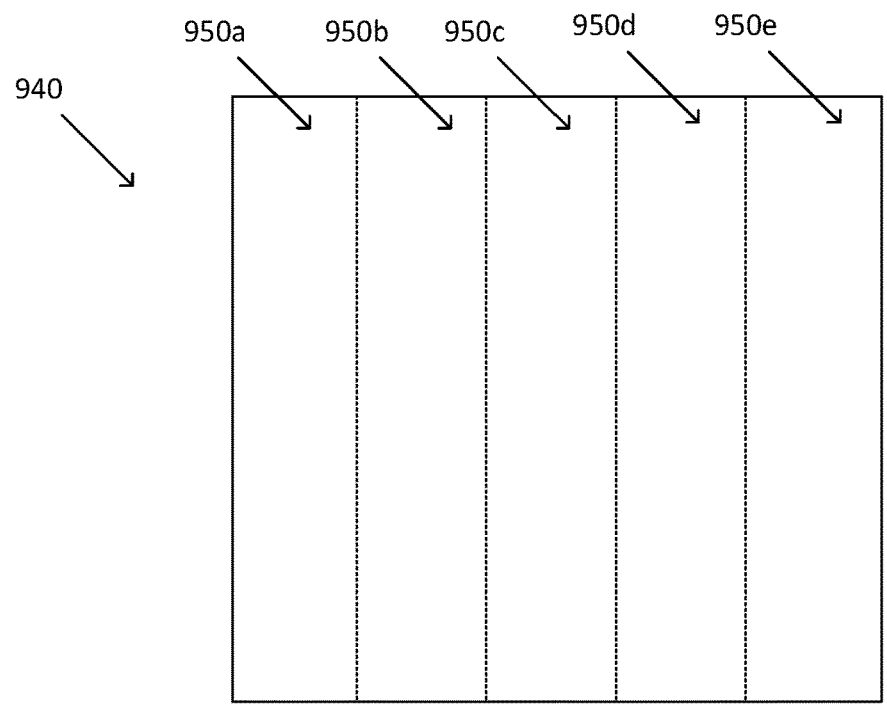

FIG. 9C illustrates an example of column-shaped transmission frequency regions 950a through 950n (generically referred to as a region 950) for use by an ultrasonic fingerprint sensor 940 underlying a matching layer of non-uniform thickness, according to an embodiment. For example, column-shaped transmission frequency regions 950 of FIG. 9C may be used in a matching layer having a thickness change in the horizontal direction. As illustrated, ultrasonic fingerprint sensor 940 has five column-shaped regions having varying transmission frequencies. It should be appreciated that a region 950 can include one or more ultrasonic transducers. It should also be appreciated that some regions 950 can have the same operating transmission frequency of ultrasonic transducers.

Figure 9D:
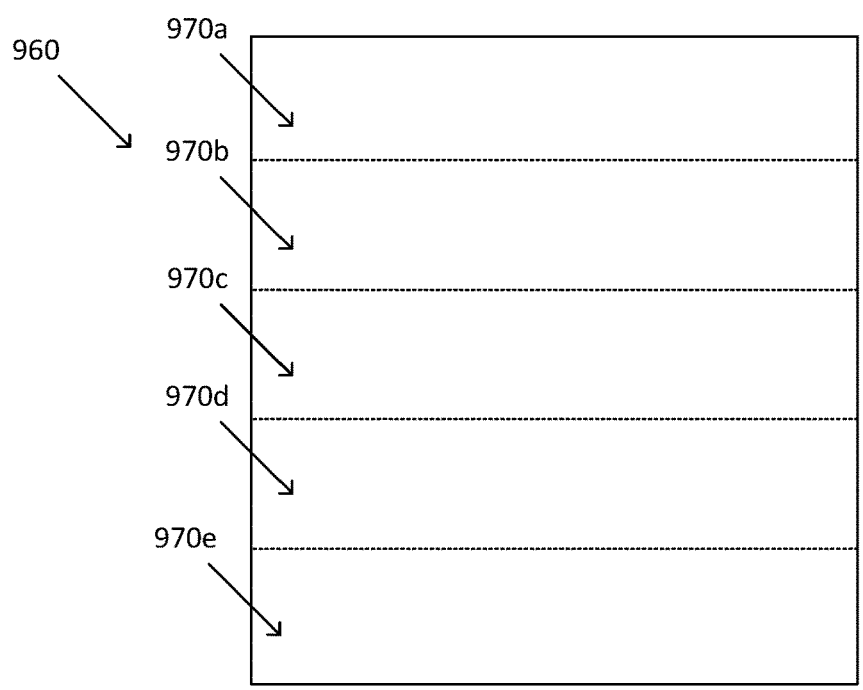

FIG. 9D illustrates an example of row-shaped transmission frequency regions 970a through 970n (generically referred to as a region 970) for use by an ultrasonic fingerprint sensor 960 underlying a matching layer of non-uniform thickness, according to an embodiment. For example, row-shaped transmission frequency regions 970 of FIG. 9D may be used in a matching layer having a thickness change in the vertical direction. As illustrated, ultrasonic fingerprint sensor 960 has five row-shaped regions having varying transmission frequencies. It should be appreciated that a region 970 can include one or more ultrasonic transducers. It should also be appreciated that some regions 970 can have the same operating transmission frequency of ultrasonic transducers.

During imaging, different portions of an image are captured using the different transmission frequencies at the different regions. Pixels of the frequency regions may be captured based on the order of the frequency regions, for example with reference to FIG. 9A, starting with region 910a, then 910b, etc. Alternatively, pixels of the frequency regions may be captured in order of frequency, going from a low frequency to a high frequency, or vice-versa. It should be appreciated that portions can be individually captured or all portions using the same transmission frequency can be captured at the same imaging operation. In other embodiments, entire images may be captured using particular transmission frequencies, and the pertinent pixels may be extracted from these images for use in the final output image. The pixels corresponding to the frequency regions are then combined into a single output image.

It should be appreciated that each frequency region may operate to capture pixels during an imaging process in parallel, in series, or concurrently. Where the pixels are captured in series, the image capture may have latency, so the decision as to whether to capture pixels of different frequency regions in parallel, in series, or concurrently may be device or application specific. For example, different applications may have a requirement for higher resolution images (e.g., security applications). Accordingly, security applications may utilize in series pixel capture to capture a high resolution image, accepting the additional latency, while other applications may utilize different pixel capture ordering in parallel or concurrently to capture images with lower latency.

FIGS. 10 and 11 illustrate flow diagrams of example methods for operating a fingerprint sensor comprised of ultrasonic transducers, according to various embodiments. Procedures of these methods will be described with reference to elements and/or components of various figures described herein. It is appreciated that in some embodiments, the procedures may be performed in a different order than described, that some of the described procedures may not be performed, and/or that one or more additional procedures to those described may be performed. The flow diagrams include some procedures that, in various embodiments, are carried out by one or more processors (e.g., a host processor or a sensor processor) under the control of computer-readable and computer-executable instructions that are stored on non-transitory computer-readable storage media. It is further appreciated that one or more procedures described in the flow diagrams may be implemented in hardware, or a combination of hardware with firmware and/or software.

FIG. 10 illustrates a flow diagram 1000 of an example method for operating an ultrasonic sensor including a two-dimensional array of ultrasonic transducers, according to embodiments. The ultrasonic sensor includes a two-dimensional array of ultrasonic transducers, a contact layer overlying the two-dimensional array of ultrasonic transducers, and a matching layer between the two-dimensional array of ultrasonic transducers and the contact layer for bonding the two-dimensional array of ultrasonic transducers to the contact layer, where the matching layer has a non-uniform thickness overlying the two-dimensional array of ultrasonic transducers.

In some embodiments, the matching layer has an acoustic impedance between an acoustic impedance of the two-dimensional array of ultrasonic transducers and an acoustic impedance of the contact layer. In some embodiments, the ultrasonic sensor further includes a packaging epoxy overlying the two-dimensional array of ultrasonic transducers, such that the matching layer is connected to the packaging epoxy and the contact layer. In some embodiments, a first thickness of the matching layer at a first region is substantially equal to a quarter wavelength of the first transmission frequency plus or minus a one-eighth wavelength of the first transmission frequency and a second thickness of the matching layer at a second region is substantially equal to a quarter wavelength of the second transmission frequency plus or minus a one-eighth wavelength of the second transmission frequency.

At procedure 1010 of flow diagram 1000, a first subset of ultrasonic transducers of the two-dimensional array of ultrasonic transducers associated with a first region of the two-dimensional array of ultrasonic transducers is activated at a first transmission frequency to image a first subset of pixels, wherein the first transmission frequency is determined such that a first thickness of the matching layer at the first region is substantially equal to a quarter wavelength of the first transmission frequency.

At procedure 1020, a second subset of ultrasonic transducers of the two-dimensional array of ultrasonic transducers associated with a second region of the two-dimensional array of ultrasonic transducers is activated at a second transmission frequency to image a second subset of pixels, where the second transmission frequency is determined such that a second thickness of the matching layer at the second region is substantially equal to a quarter wavelength of the second transmission frequency, wherein the first region and the second region are non-overlapping regions of the two-dimensional array of ultrasonic transducers and wherein the first thickness and the second thickness are different. It should be appreciated that procedure 1020 can be performed sequential to, parallel to, or concurrent to procedure 1010.

In some embodiments, as shown at procedure 1030, a third subset of ultrasonic transducers of the two-dimensional array of ultrasonic transducers associated with a third region of the two-dimensional array of ultrasonic transducers is activated at a third transmission frequency to image a third subset of pixels, wherein a third thickness of the matching layer at the third region is substantially equal to a quarter wavelength of the third transmission frequency, wherein the first region, the second region, and the third region are non-overlapping regions of the two-dimensional array of ultrasonic transducers. It should be appreciated that procedure 1030 can be performed sequential to, parallel to, or concurrent to procedures 1010 and/or 1020.

At procedure 1040, the first subset of pixels and the second subset of pixels are combined into a compound fingerprint image, wherein the compound fingerprint image compensates for the non-uniform thickness of the matching layer. In one embodiment, the third subset is also combined into the compound fingerprint image.

FIG. 11 illustrates a flow diagram 1100 of an example method for calibrating an ultrasonic sensor including a two-dimensional array of ultrasonic transducers, according to embodiments. The ultrasonic sensor includes a two-dimensional array of ultrasonic transducers, a contact layer overlying the two-dimensional array of ultrasonic transducers, and a matching layer between the two-dimensional array of ultrasonic transducers and the contact layer, where the matching layer has a non-uniform thickness overlying the two-dimensional array of ultrasonic transducers. In some embodiments, a thickness of the matching layer at each region is substantially equal to a quarter wavelength of a transmission frequency for the region. In some embodiments, the thickness of the matching layer at each region is substantially equal to a quarter wavelength of the transmission frequency plus or minus a one-eighth wavelength of the transmission frequency at the region. In some embodiments, the matching layer is an adhesive layer for bonding the two-dimensional array of ultrasonic transducers to the contact layer. In some embodiments, the matching layer has an acoustic impedance between an acoustic impedance of the two-dimensional array of ultrasonic transducers and an acoustic impedance of the contact layer.

At procedure 1110 of flow diagram 1100, ultrasonic transducers of the two-dimensional array of ultrasonic transducers associated with a plurality of regions of the two-dimensional array of ultrasonic transducers are activated at a plurality of transmission frequencies, where the plurality of regions are non-overlapping. At procedure 1120 of flow diagram 1100, a signal for each of the plurality of transmission frequencies at the plurality of regions is monitored.

In one embodiment, as shown at procedure 1130, it is determined how ultrasonic transducers are grouped with the available frequencies. In one embodiment, where there are a certain number of fixed transmission frequencies, it is determined which ultrasonic transducers are grouped with which transmission frequency, where the frequency is chosen such that the matching layer thickness is closest to a quarter wavelength. In another embodiment, where there are a certain number of flexible transmission frequencies, it is determined which ultrasonic transducers are grouped with which transmission frequency. For example, a distribution of transmission frequencies and groups is determined to get the best result, e.g., optimizing a loss function for the total sensor, where a loss function depends on deviation from ideal quarter wavelength setting. In another embodiment, where there are unlimited or individually controllable transmission frequencies, each ultrasonic transducers is assigned a transmission frequency. At procedure 1140, for the plurality of regions, a transmission frequency of the plurality of transmission frequencies having a highest signal for a region is set as the transmission frequency for the region.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems and components have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Thus, the embodiments and examples set forth herein were presented in order to best explain various selected embodiments of the present invention and its particular application and to thereby enable those skilled in the art to make and use embodiments of the invention. However, those skilled in the art will recognize that the foregoing description and examples have been presented for the purposes of illustration and example only. The description as set forth is not intended to be exhaustive or to limit the embodiments of the invention to the precise form disclosed.

What is claimed is:

1. An ultrasonic sensor comprising:
a two-dimensional array of ultrasonic transducers, wherein the two-dimensional array of ultrasonic transducers is substantially flat;
a contact layer overlying the two-dimensional array of ultrasonic transducers;
a matching layer between the two-dimensional array of ultrasonic transducers and the contact layer, wherein the matching layer has a non-uniform thickness overlying the two-dimensional array of ultrasonic transducers; and
an array controller configured to control activation of ultrasonic transducers during an imaging operation for imaging a plurality of pixels at a plurality of positions within the two-dimensional array of ultrasonic transducers, such that during the imaging operation, the array controller is configured to:
activate a first subset of ultrasonic transducers of the two-dimensional array of ultrasonic transducers associated with a first region of the two-dimensional array of ultrasonic transducers at a first transmission frequency, wherein the first transmission frequency is determined such that a first thickness of the matching layer at the first region is substantially equal to a quarter wavelength of the first transmission frequency;
activate a second subset of ultrasonic transducers of the two-dimensional array of ultrasonic transducers associated with a second region of the two-dimensional array of ultrasonic transducers at a second transmission frequency, wherein the second transmission frequency is determined such that a second thickness of the matching layer at the second region is substantially equal to a quarter wavelength of the second transmission frequency, wherein the first region and the second region are non-overlapping regions of the two-dimensional array of ultrasonic transducers and wherein the first thickness and the second thickness are different; and
combine the plurality of pixels into a compound fingerprint image, wherein the compound fingerprint image compensates for the non-uniform thickness of the matching layer.

2. The ultrasonic sensor of claim 1, wherein the first region and the second region are associated with different blocks of ultrasonic transducers of the two-dimensional array of ultrasonic transducers.

3. The ultrasonic sensor of claim 1, wherein the first region and the second region are associated with different columns of ultrasonic transducers of the two-dimensional array of ultrasonic transducers.

4. The ultrasonic sensor of claim 1, wherein the first region and the second region are associated with different rows of ultrasonic transducers of the two-dimensional array of ultrasonic transducers.

5. The ultrasonic sensor of claim 1, wherein the first thickness of the matching layer at the first region is substantially equal to a quarter wavelength of the first transmission frequency plus or minus a one-eighth wavelength of the first transmission frequency and the second thickness of the matching layer at the second region is substantially equal to a quarter wavelength of the second transmission frequency plus or minus a one-eighth wavelength of the second transmission frequency.

6. The ultrasonic sensor of claim 1, wherein during the imaging operation, the array controller is configured to:
activate a third subset of ultrasonic transducers of the two-dimensional array of ultrasonic transducers associated with a third region of the two-dimensional array of ultrasonic transducers at a third transmission frequency, wherein a third thickness of the matching layer at the third region is substantially equal to a quarter wavelength of the third transmission frequency, wherein the first region, the second region, and the third region are non-overlapping regions of the two-dimensional array of ultrasonic transducers.

7. The ultrasonic sensor of claim 6, wherein the first thickness, the second thickness, and the third thickness are different.

8. The ultrasonic sensor of claim 1, wherein the matching layer has an acoustic impedance between an acoustic impedance of the two-dimensional array of ultrasonic transducers and an acoustic impedance of the contact layer.

9. The ultrasonic sensor of claim 1, further comprising a packaging epoxy overlying the two-dimensional array of ultrasonic transducers, such that the matching layer is connected to the packaging epoxy and the contact layer.

10. The ultrasonic sensor of claim 1, wherein the matching layer is an adhesive layer for bonding the two-dimensional array of ultrasonic transducers to the contact layer.

11. A method for operating an ultrasonic sensor comprising a two-dimensional array of ultrasonic transducers, a contact layer overlying the two-dimensional array of ultrasonic transducers, and a matching layer between the two-dimensional array of ultrasonic transducers and the contact layer, wherein the matching layer has a non-uniform thickness overlying the two-dimensional array of ultrasonic transducers, the method comprising:

activating a first subset of ultrasonic transducers of the two-dimensional array of ultrasonic transducers associated with a first region of the two-dimensional array of ultrasonic transducers at a first transmission frequency to image a first subset of pixels, wherein the first transmission frequency is determined such that a first thickness of the matching layer at the first region is substantially equal to a quarter wavelength of the first transmission frequency;

activating a second subset of ultrasonic transducers of the two-dimensional array of ultrasonic transducers associated with a second region of the two-dimensional array of ultrasonic transducers at a second transmission frequency to image a second subset of pixels, wherein the second transmission frequency is determined such that a second thickness of the matching layer at the second region is substantially equal to a quarter wavelength of the second transmission frequency, wherein the first region and the second region are non-overlapping regions of the two-dimensional array of ultrasonic transducers and wherein the first thickness and the second thickness are different; and combining the first subset of pixels and the second subset of pixels into a compound fingerprint image, wherein the compound fingerprint image compensates for the non-uniform thickness of the matching layer.

12. The method of claim 11, wherein the first thickness of the matching layer at the first region is substantially equal to a quarter wavelength of the first transmission frequency plus or minus a one-eighth wavelength of the first transmission frequency and the second thickness of the matching layer at the second region is substantially equal to a quarter wavelength of the second transmission frequency plus or minus a one-eighth wavelength of the second transmission frequency.

13. The method of claim 11, further comprising:

activating a third subset of ultrasonic transducers of the two-dimensional array of ultrasonic transducers associated with a third region of the two-dimensional array of ultrasonic transducers at a third transmission frequency to image a third subset of pixels, wherein a third thickness of the matching layer at the third region is substantially equal to a quarter wavelength of the third transmission frequency, wherein the first region, the second region, and the third region are non-overlapping regions of the two-dimensional array of ultrasonic transducers.

14. The method of claim 13, wherein the first thickness, the second thickness, and the third thickness are different.

15. The method of claim 11, wherein the activating the first subset of ultrasonic transducers and the activating the second subset of ultrasonic transducers is based on requirement of an application using the compound fingerprint image.

* * * * *